US010833121B2

(12) United States Patent
Rosenblatt et al.

(10) Patent No.: US 10,833,121 B2
(45) Date of Patent: Nov. 10, 2020

(54) VERTICAL SILICON-ON-METAL SUPERCONDUCTING QUANTUM INTERFERENCE DEVICE

(71) Applicant: International Business Machines Corporation, Armonk, NY (US)

(72) Inventors: Sami Rosenblatt, White Plains, NY (US); Jared Barney Hertzberg, Yorktown Heights, NY (US); Rasit Onur Topaloglu, Poughkeepsie, NY (US); Markus Brink, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/740,686

(22) Filed: Jan. 13, 2020

(65) Prior Publication Data

US 2020/0152696 A1 May 14, 2020

Related U.S. Application Data

(62) Division of application No. 16/006,436, filed on Jun. 12, 2018, now Pat. No. 10,615,223.

(51) Int. Cl.
*H01L 27/18* (2006.01)
*H01L 39/24* (2006.01)
(Continued)

(52) U.S. Cl.
CPC .......... *H01L 27/18* (2013.01); *H01L 39/2493* (2013.01); *G01R 33/0354* (2013.01);
(Continued)

(58) Field of Classification Search
CPC ... H01L 27/18; H01L 39/2493; H01L 39/025; H01L 39/223–226; H01L 39/00–2496;
(Continued)

(56) References Cited

U.S. PATENT DOCUMENTS 4,220,959 A * 9/1980 Kroger ................. H01L 39/223
257/32
5,547,922 A 8/1996 Ma
(Continued)

FOREIGN PATENT DOCUMENTS

WO 2017/116442 A1 7/2017
WO 2018/030977 A1 2/2018

OTHER PUBLICATIONS

Non-Final Office Action received for U.S. Appl. No. 16/006,436 dated Aug. 19, 2019, 19 pages.
(Continued)

*Primary Examiner* — Shahed Ahmed
(74) *Attorney, Agent, or Firm* — Amin, Turocy & Watson, LLP

(57) ABSTRACT

Techniques related to vertical silicon-on-metal superconducting quantum interference devices and method of fabricating the same are provided. Also provided are associated flux control and biasing circuitry. A superconductor structure can comprise a silicon-on-metal substrate that can comprise a first superconducting layer, comprising a first superconducting material, between a first crystalline silicon layer and a second crystalline silicon layer. The superconducting structure can also comprise a first via comprising a first Josephson junction and a second via comprising a second Josephson junction. The first via and the second via can be formed between the first superconducting layer and a second superconducting layer, comprising a second superconducting material. An electrical loop around a defined area of the second crystalline silicon layer can comprise the first via
(Continued)

comprising the first Josephson junction, the second via comprising the second Josephson junction, the first superconducting layer, and the second superconducting layer.

6 Claims, 39 Drawing Sheets

(51) Int. Cl.
    *G01R 33/035*     (2006.01)
    *H01L 39/02*     (2006.01)
    *H01L 39/22*     (2006.01)
    *H03K 19/195*     (2006.01)

(52) U.S. Cl.
    CPC .......... *H01L 39/025* (2013.01); *H01L 39/223* (2013.01); *H03K 19/195* (2013.01)

(58) Field of Classification Search
    CPC ......... H01L 21/76891; H01L 23/49888; H01L 23/53285; H01L 35/225; G01R 33/0354; H03K 3/38; H03K 19/195–1958; G06N 99/002; B82Y 10/00; Y10S 977/933
    See application file for complete search history.

(56) References Cited

U.S. PATENT DOCUMENTS

| | | | |
|---|---|---|---|
| 6,979,836 B2 | 12/2005 | Zagoskin et al. | |
| 7,261,776 B2 | 8/2007 | Rupich et al. | |
| 9,397,283 B2 | 7/2016 | Abraham et al. | |
| 9,455,391 B1 | 9/2016 | Nayfeh et al. | |
| 9,520,547 B2 | 12/2016 | Abraham et al. | |
| 9,524,470 B1 | 12/2016 | Chow et al. | |
| 9,768,371 B2 | 9/2017 | Ladizinsky et al. | |
| 2008/0032501 A1 | 2/2008 | Klein et al. | |
| 2009/0173936 A1* | 7/2009 | Bunyk ................... B82Y 10/00 257/31 |
| 2012/0019236 A1* | 1/2012 | Tiernan ............... G01N 27/9033 324/234 |
| 2015/0372217 A1* | 12/2015 | Schoelkopf, III ...... H01L 39/24 505/413 |
| 2017/0186935 A1 | 6/2017 | Bonetti et al. | |
| 2018/0069288 A1* | 3/2018 | Minev ..................... H01P 7/065 |
| 2019/0097118 A1* | 3/2019 | Rouse ............... H01L 39/26467 |

OTHER PUBLICATIONS

Yang et al., "A Squid Gradiometer Module With Large Junction Shunt Resistors", Chin. Phys.B,2014,088503,vol. 23, No. 8, Chinese Physical Society and IOP Publishing Ltd, 3 pages.

Mantl, "Compound Formation by Ion Beam Synthesis and a Comparison With Alternative Methods Such as Deposition and Growth or Wafer Bonding," Nuclear Instruments and Methods in Physics Research B 106, 1995, pp. 355-363, Elsevier Science BV., 9 pages.

Goodyear et al., "Vertical c-axis Microbridge Junctions in YBa2Cu3O7/PrBa2Cu3O7 Thin Films," IEEE Transactions on Applied Superconductivity, Jun. 1995, pp. 3143-3146, vol. 5, No. 2, British Crown Copyright, 4 pages.

International Search Report and Written Opinion for International Application Serial No. PCT/EP2019/065068 dated Aug. 23, 2019.

List of IBM Patents or Applications Treated as Related.

* cited by examiner

VERTICAL SILICON-ON-METAL SUPERCONDUCTING QUANTUM INTERFERENCE DEVICE

BACKGROUND

The subject embodiments of the invention relate to superconducting devices, and more specifically, to quantum interference devices and methods of fabricating the same. Superconducting quantum interference devices are utilized heavily in superconducting circuits. However, the superconducting quantum interference devices have large footprints due to a size of a loop area. Further, superconducting quantum interference devices can only detect fields orthogonal to the loop, which may be limiting for some circuits, especially if the loops are laid out on the substrate plane.

For example, Zagoskin et al. (U.S. Pat. No. 6,979,836) discusses "[a] superconducting structure that can operate, for example, as a qubit or a superconducting switch." See Abstract. Zagoskin et al. also discusses that a "junction [ ] is preferably a grain boundary junction". See, for example, column 11, line 62. In addition, Zagoskin et al. discusses " . . . a grain boundary junction, such as [a] junction [ ] between two unconventional superconductors . . . " See column 13, lines 9-11. In Zagoskin et al., an insulating material is "aluminum oxide ($Al_2O_3$) and silicon dioxide ($SiO_2$)." See column 16, lines 60 and 61. However, aluminum oxide and silicon dioxide insulators cannot provide adequate performance for quantum computing applications because of the low loss requirements. Further, unconventional superconductors contribute to additional costs and fabrication complexity.

SUMMARY

The following presents a summary to provide a basic understanding of one or more embodiments of the invention. This summary is not intended to identify key or critical elements or delineate any scope of the particular embodiments or any scope of the claims. Its sole purpose is to present concepts in a simplified form as a prelude to the more detailed description that is presented later. In one or more embodiments described herein, systems, computer-implemented methods, methods, apparatuses, devices, and/or computer program products that facilitate vertical silicon-on-metal superconducting quantum interference devices. Also provided are associated flux control and biasing circuitry for vertical silicon-on-metal superconducting quantum interference devices.

According to an embodiment, a superconducting structure can comprise a silicon-on-metal substrate that can comprise a first superconducting layer between a first crystalline silicon layer and a second crystalline silicon layer. The first superconducting layer can comprise a first superconducting material. The superconducting structure can also comprise a first via between, and in contact with, a first section of the first superconducting layer and a first portion of a second superconducting layer. The first via can comprise a first Josephson junction. The second superconducting layer can be over the second crystalline silicon layer and can comprise a second superconducting material. The superconducting structure can also comprise a second via between, and in contact with, a second section of the first superconducting layer and a second portion of the second superconducting layer. The second via can comprise a second Josephson junction. An electrical loop around a defined area of the second crystalline silicon layer can comprise the first via comprising the first Josephson junction, the second via comprising the second Josephson junction, the first superconducting layer, and the second superconducting layer.

In an example, a first side of the second superconducting layer can be flush with a first edge of the silicon-on-metal substrate and a second side of the second superconducting layer can be flush with a second edge of the silicon-on-metal substrate. According to some implementations, a shape of the second superconducting layer can be selected based on a defined shape of the electrical loop.

In accordance with some implementations, the superconducting structure can comprise a first trench that can extend through the second crystalline silicon layer a first distance from, and adjacent to, the first via comprising the first Josephson junction. The superconducting structure can also comprise a second trench that extends through the second crystalline silicon layer a second distance from, and adjacent to, the second via comprising the second Josephson junction. Further to these implementations, the first trench and the second trench can electrically isolate the superconducting structure from one or more circuits.

According to some implementations, the superconducting structure can comprise a first external electrical connection terminal at the first superconducting layer and a second external electrical connection terminal at the second superconducting layer. In some implementations, the superconducting structure can comprise a coupling capacitor over the second crystalline silicon layer and at a first distance from the electrical loop and near an interconnect for an external electrical connection.

In other implementations, the superconducting structure can comprise a first loop contact that can extend perpendicular from the second superconducting layer. The first loop contact can provide a first terminal for an electrical connection. The superconducting structure can also comprise a second loop contact over the second crystalline silicon layer and opposite the first loop contact. The second loop contact can provide a second terminal for the electrical connection.

In accordance with some implementations, the superconducting structure can comprise a wire over at least a portion of the second crystalline silicon layer and parallel to the electrical loop. According to some implementations, the superconducting structure can comprise a wire over at least a portion of the first crystalline silicon layer and parallel to the electrical loop. In other implementations, the superconducting structure can comprise two or more wires in parallel and over the first superconducting layer. The two or more wires can form parallel electrical loops.

Another embodiment can relate to a method that can comprise forming a silicon-on-metal substrate comprising a first superconducting layer between a first crystalline silicon layer and a second crystalline silicon layer. The first superconducting layer can comprise a first superconducting material. The method can also comprise forming a first via between, and in contact with, a first section of the first superconducting layer and a first portion of a second superconducting layer. The first via can comprise a first Josephson junction. The second superconducting layer can be over the second crystalline silicon layer and can comprise a second superconducting material. In addition, the method can comprise forming a second via between, and in contact with, a second section of the first superconducting layer and a second portion of the second superconducting layer. The second via can comprise a second Josephson junction. An electrical loop around a defined area of the second crystalline silicon layer can comprise the first via comprising the first Josephson junction, the second via comprising the second Josephson junction, the first superconducting layer, and the second superconducting layer.

In an example, the method can comprise etching a first side of the second superconducting layer flush with a first edge of the silicon-on-metal substrate and a second side of the second superconducting layer flush with a second edge of the silicon-on-metal substrate.

In another example, the method can comprise forming a first trench through the second crystalline silicon layer a first distance from, and adjacent to, the first via comprising the first Josephson junction. Further to this example, the method can comprise forming a second trench through the second crystalline silicon layer a second distance from, and adjacent to, the second via comprising the second Josephson junction.

In some implementations, the method can comprise providing at least one of a first external electrical connection at the first superconducting layer or a second electrical connection at the second superconducting layer. According to some implementations, the method can comprise providing a wire parallel to the electrical loop. The wire can be provided over the second crystalline silicon layer for control of the magnetic flux through the electrical loop, or over the first crystalline silicon layer for control of the magnetic flux through the electrical loop. In an additional, or alternative implementation, the method can comprise providing two or more wires in parallel over the first superconducting layer, wherein the two or more wires form parallel electrical loops.

Another embodiment provided herein is a superconducting device that can comprise a silicon-on-metal substrate comprising a first superconducting layer between a first crystalline silicon layer and a second crystalline silicon layer. The first superconducting layer can comprise a first superconducting material. The superconducting device can also comprise a first via between, and in contact with, a first section of the first superconducting layer and a first portion of a second superconducting layer. The first via can comprise a first Josephson junction. The second superconducting layer can be over the second crystalline silicon layer and can comprise a second superconducting material. Further, the superconducting device can comprise a second via between, and in contact with, a second section of the first superconducting layer and a second portion of the second superconducting layer. The second via can comprise a second Josephson junction. An electrical loop around a defined area of the second crystalline silicon layer can comprise the first via comprising the first Josephson junction, the second via comprising the second Josephson junction, the first superconducting layer, and the second superconducting layer.

In an implementation, the superconducting device can also comprise a first trench that extends through the second crystalline silicon layer a first distance from, and adjacent to, the first via comprising the first Josephson junction. Further, the superconducting device can comprise a second trench that extends the second crystalline silicon layer a second distance from, and adjacent to, the second via comprising the second Josephson junction.

According to some implementations, the superconducting device can comprise a first loop contact that can extend perpendicular from the second superconducting layer. The first loop contact can provide a first terminal for an electrical connection. Further, the superconducting device can comprise a second loop contact over the second crystalline silicon layer and opposite the first loop contact. The second loop contact can provide a second terminal for the electrical connection.

According to some implementations, the superconducting device can comprise two or more wires in parallel and over the first superconducting layer. The two or more wires can form parallel electrical loops.

Another embodiment relates to a superconducting structure that can comprise a silicon-on-metal substrate comprising a first superconducting layer between a first crystalline silicon layer and a second crystalline silicon layer. The first superconducting layer can comprise a first superconducting material. The superconducting structure can also comprise a first via between, and in contact with, a first section of the first superconducting layer and a first portion of a second superconducting layer. The first via can comprise a first Josephson junction. The second superconducting layer can be over the second crystalline silicon layer and can comprise a second superconducting material. In addition, the superconducting structure can comprise a second via between, and in contact with, a second section of the first superconducting layer and a second portion of the second superconducting layer. The second via can comprise a second Josephson junction. An electrical loop around a defined area of the second crystalline silicon layer can comprise the first via comprising the first Josephson junction, the second via comprising the second Josephson junction, the first superconducting layer, and the second superconducting layer.

A further embodiment provided herein relates to a superconducting device that can comprise a silicon-on-metal substrate comprising a first superconducting layer between a first crystalline silicon layer and a second crystalline silicon layer. The first superconducting layer can comprise a first superconducting material. The superconducting device can also comprise a first via and a second via. The first via can be between, and in contact with, a first section of the first superconducting layer and a first portion of a second superconducting layer. The first via can comprise a first Josephson junction. The second superconducting layer can be over the second crystalline silicon layer and can comprise a second superconducting material. The second via can be between, and in contact with, a second section of the first superconducting layer and a second portion of the second superconducting layer. The second via can comprise a second Josephson junction. An electrical loop around a defined area of the second crystalline silicon layer can comprise the first via comprising the first Josephson junction, the second via comprising the second Josephson junction, the first superconducting layer, and the second superconducting layer. The superconducting device can also comprise a first trench that can extend through the second crystalline silicon layer a first distance from, and adjacent to, the first via comprising the first Josephson junction and a second trench that can extend through the second crystalline silicon layer a second distance from, and adjacent to, the second via comprising the second Josephson junction.

In an example, the superconducting device can comprise a first external electrical connection terminal at the first superconducting layer and a second external electrical connection terminal at the second superconducting layer. In another example, the superconducting device can comprise two or more wires in parallel and over the first superconducting layer, wherein the two or more wires form parallel electrical loops.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Provided herein is a vertical silicon-on-metal superconducting quantum interference device (abbreviated as SQUID). Also provided herein are associated flux control (also referred to as magnetic flux control) and biasing circuitry for vertical silicon-on-metal superconducting quantum interference devices. The various aspects can reduce a footprint of superconducting quantum interference devices through the use of one or more vertical Josephson junction devices. In addition, electrical loops can reside mostly on the plane orthogonal to the substrate as discussed herein. If an electrical loop comprises a SQUID, it can also be referred to as a SQUID loop.

Figure 1:
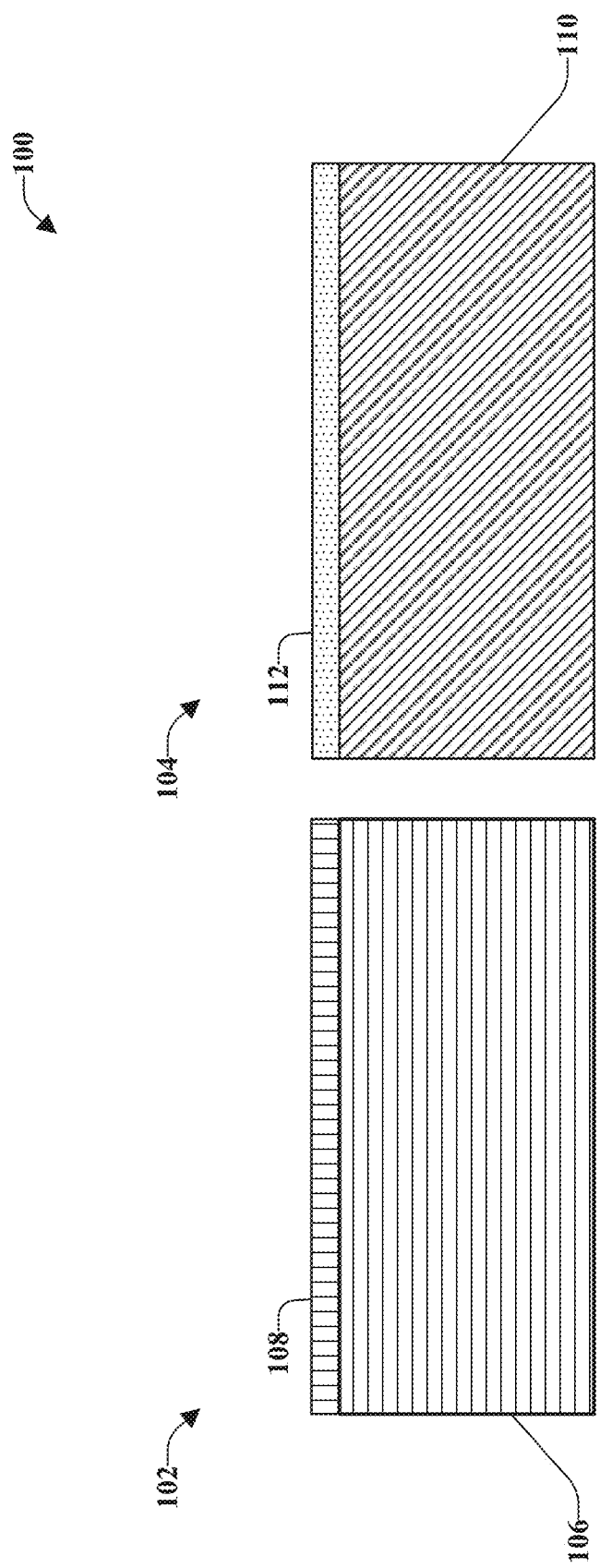
FIG. 1 illustrates an example, non-limiting, side cross-sectional view of a structure for an embodiment of a silicon-on-metal substrate during a fabrication process wherein a first wafer and a second wafer are formed in accordance with one or more embodiments described herein.

FIG. 1 illustrates an example, non-limiting, side cross-sectional view of a structure for an embodiment of a silicon-on-metal substrate 100 during a fabrication process wherein a first wafer 102 and a second wafer 104 are formed in accordance with one or more embodiments described herein.

The first wafer 102 can comprise a first layer of silicon. According to an implementation, the first layer of silicon can be a first crystalline silicon layer 106. The first wafer 102 can also comprise a superconductor (e.g., a first superconducting metal 108) that can be attached to the first crystalline silicon layer 106. The superconductor layer can be deposited (e.g., sputtering, evaporation, Atomic Layer Deposition, electroplating, or another deposition technique) on the first crystalline silicon layer 106.

The second wafer 104 can comprise a second layer of silicon. The second layer of silicon can be a second superconducting layer, which can be a crystalline silicon layer (e.g., a second crystalline silicon layer 110).

Further, the second wafer 104 can also comprise a superconductor (e.g., a second superconducting metal 112) that can be attached to the second crystalline silicon layer 110. Similar to the first wafer 102, the second superconductor layer can be deposited (e.g., sputtering, evaporation, Atomic Layer Deposition, electroplating, or another deposition technique) on the second crystalline silicon layer 110. Superconducting material utilized for the first superconducting metal 108 and the second superconducting metal 112 can be a same superconducting material, a similar superconducting material, or a different superconducting material.

Figure 2:
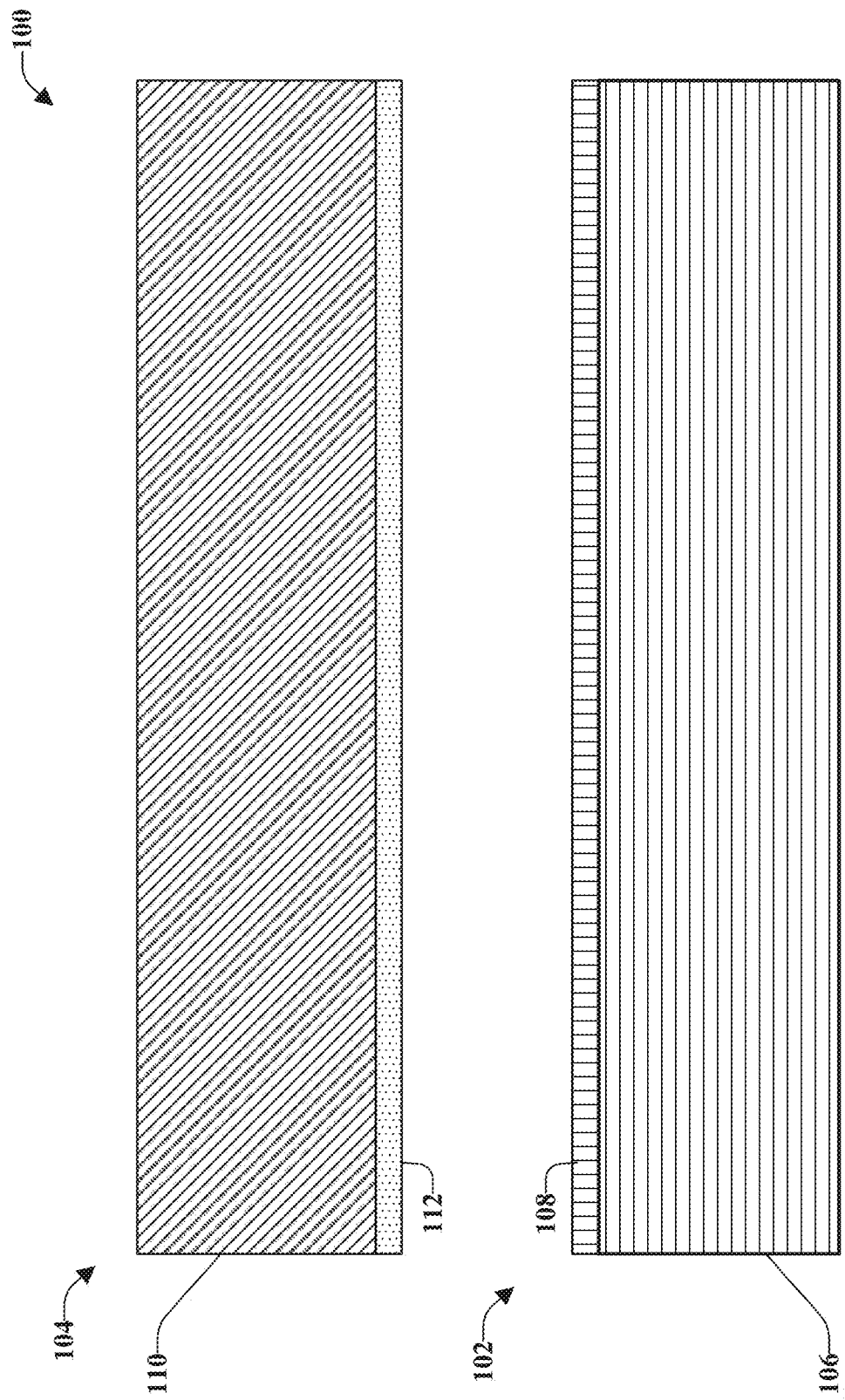
FIG. 2 illustrates an example, non-limiting, side cross-sectional view of the structure of the silicon-on-metal substrate of FIG. 1 during a fabrication process wherein the second wafer is positioned for bonding to the first wafer in accordance with one or more embodiments described herein.
Figure 3:
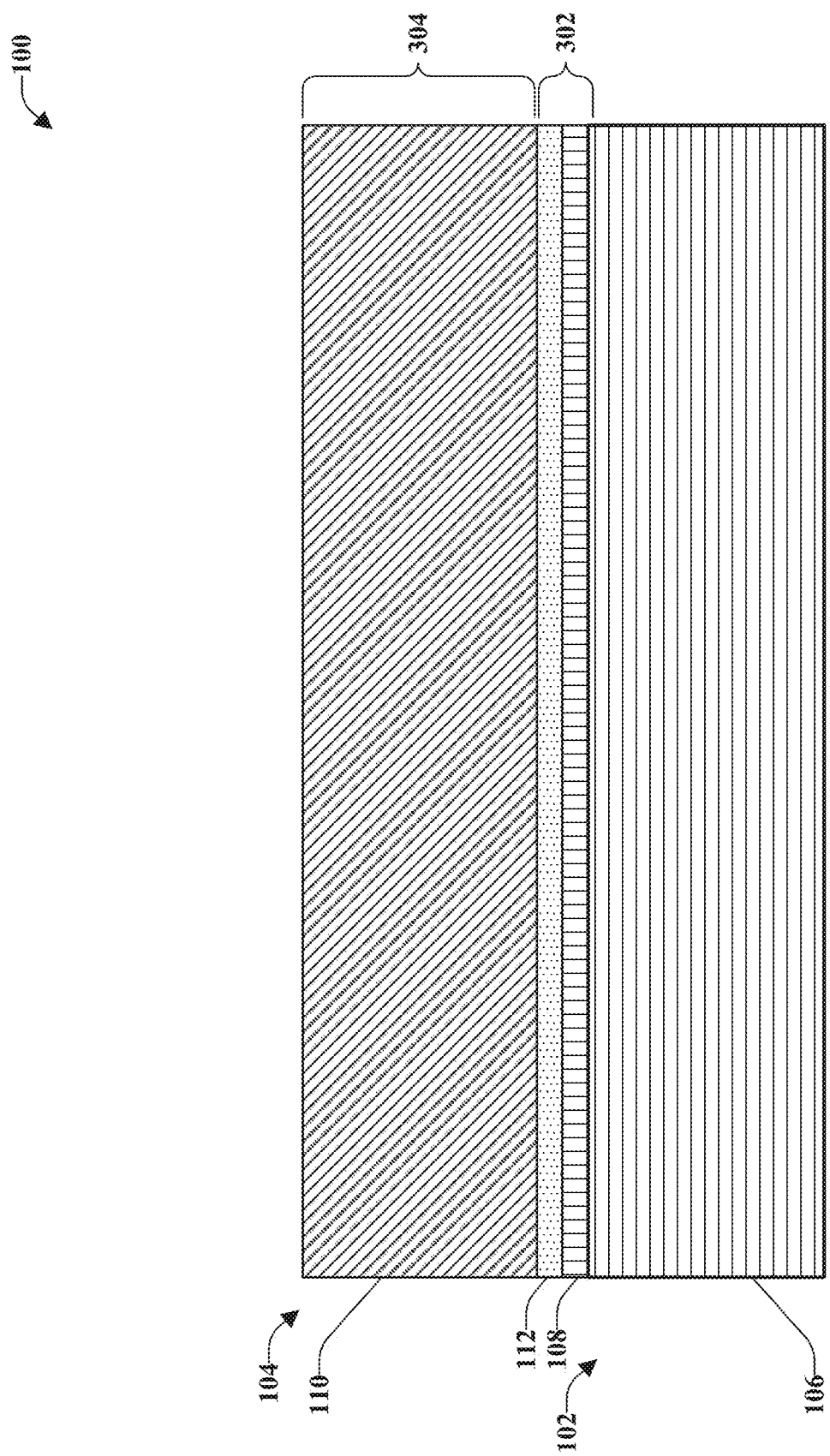
FIG. 3 illustrates an example, non-limiting, side cross-sectional view of the structure of the silicon-on-metal substrate of FIG. 2 during a fabrication process wherein the second wafer is attached to the first wafer in accordance with one or more embodiments described herein.

FIG. 2 illustrates an example, non-limiting, side cross-sectional view of the structure of the silicon-on-metal substrate 100 of FIG. 1 during a fabrication process wherein the second wafer 104 is positioned for bonding to the first wafer 102 in accordance with one or more embodiments described herein. Further, FIG. 3 illustrates an example, non-limiting, side cross-sectional view of the structure of the silicon-on-metal substrate 100 of FIG. 2 during a fabrication process wherein the second wafer 104 is attached to the first wafer 102 in accordance with one or more embodiments described herein. Repetitive description of like elements employed in other embodiments described herein is omitted for sake of brevity.

As illustrated in FIG. 2, the second wafer 104 can be turned such that the first superconducting metal 108 and the second superconducting metal 112 are facing one another (e.g., face-to-face). For example, the second wafer 104 can be turned upside down over the first wafer 102. In such a manner, the first superconducting metal 108 and the second superconducting metal 112 can be aligned with one another.

The substrates (e.g., the first wafer 102 and the second wafer 104) can be pressed against one another, as illustrated in FIG. 3. According to some implementations, heat can be applied to bond the two substrates together. However, according to some implementations, heat is not utilized. Upon or after bonding of the first wafer 102 and the second wafer 104, the first superconducting metal 108 and the second superconducting metal 112 can create a first superconducting layer 302. The first superconducting layer 302 can be a single superconducting layer based on the bonding of the first wafer 102 and the second wafer 104 and, thus, the silicon-on-metal substrate 100 is created.

Figure 4:
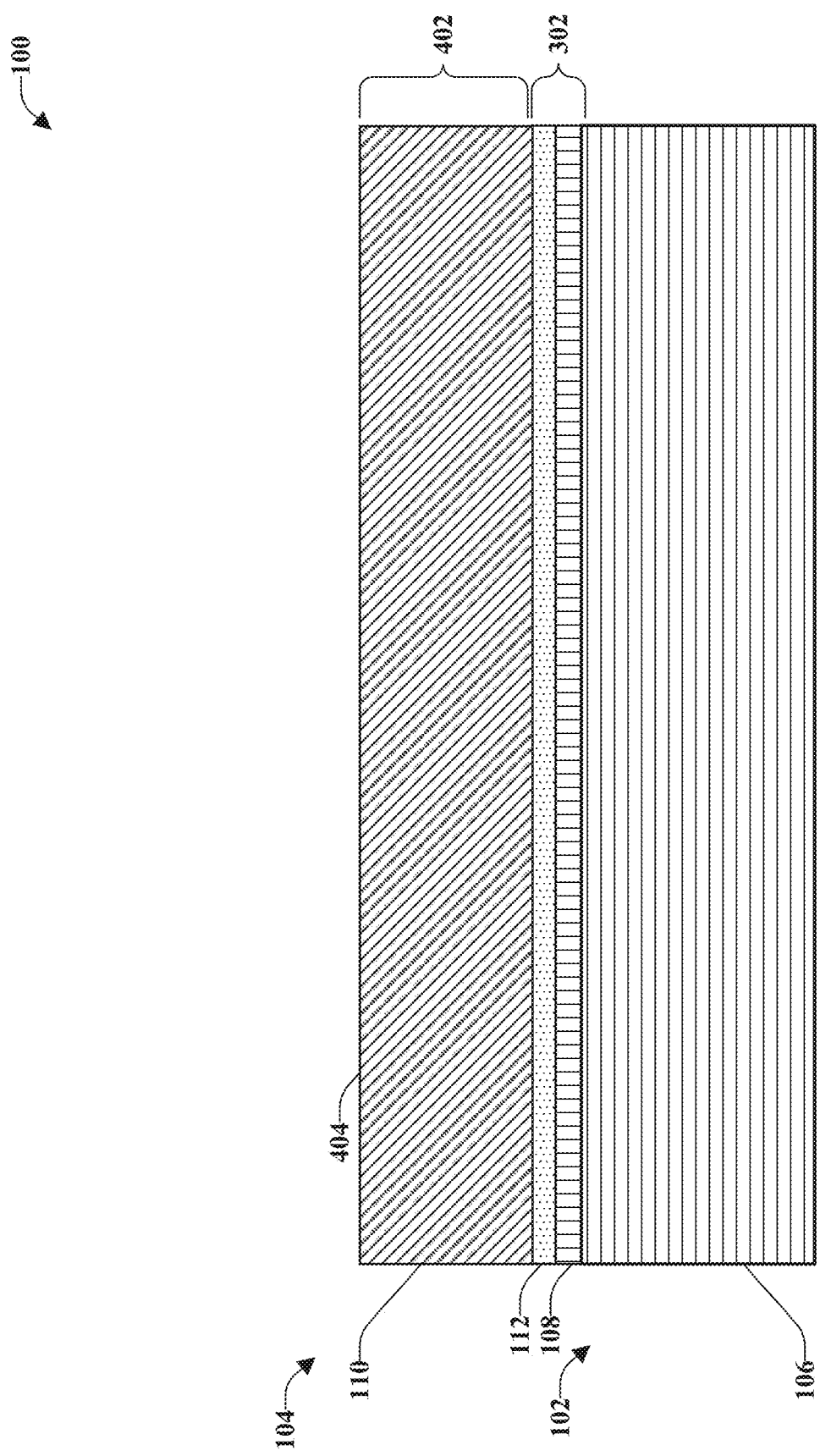
FIG. 4 illustrates an example, non-limiting, side cross-sectional view of the silicon-on-metal substrate of FIG. 3 during a fabrication process wherein a thickness of the second wafer is reduced in accordance with one or more embodiments described herein.

FIG. 4 illustrates an example, non-limiting, side cross-sectional view of the silicon-on-metal substrate 100 of FIG. 3 during a fabrication process wherein a thickness of the second wafer 200 is reduced in accordance with one or more embodiments described herein. Repetitive description of like elements employed in other embodiments described herein is omitted for sake of brevity.

The second crystalline silicon layer 110 (which can be referred to as an insulator or top insulator) can be thinned to a defined height. Therefore, upon or after the thinning of the second crystalline silicon layer 110, the first crystalline silicon layer 106 and the second crystalline silicon layer 110 can comprise different heights.

To visualize the thinning of the second crystalline silicon layer 110, refer to FIG. 3 where the second crystalline silicon layer 110 comprises a first height 304. As illustrated in FIG. 4, the second crystalline silicon layer 110 can be thinned or reduced in height to a second height 402.

To thin the second crystalline silicon layer 110, the exposed silicon surface (e.g., a top surface 404) can be ground down. According to some implementations, the second crystalline silicon layer 110 can be thinned down prior to the bonding of the first wafer 102 and the second wafer 104. However, in some implementations, the second crystalline silicon layer 110 can be thinned down upon or after the bonding of the first wafer 102 and the second wafer 104.

According to some implementations, the top surface 404 can be polished after being thinned down. Various polishing techniques can be utilized, including, but not limited to, Chemical-Mechanical Polishing (CMP). CMP is a polishing process that can be utilized to smooth surfaces. For example, CMP can utilize a chemical slurry formation and a mechanical polishing process to obtain the smooth surfaces. As illustrated, the CMP can create a level surface across the top surface 404 of the second wafer 104. The polishing of the top surface 404 is optional. However, in some cases, polishing can be better for lithography.

According to an implementation, the second crystalline silicon layer 202 can be thinned to an example, non-limiting, thickness range (e.g., the second height 402) of between around 100 nm to around 100 um. However, other thickness ranges can be utilized with the disclosed aspects.

Figure 5:
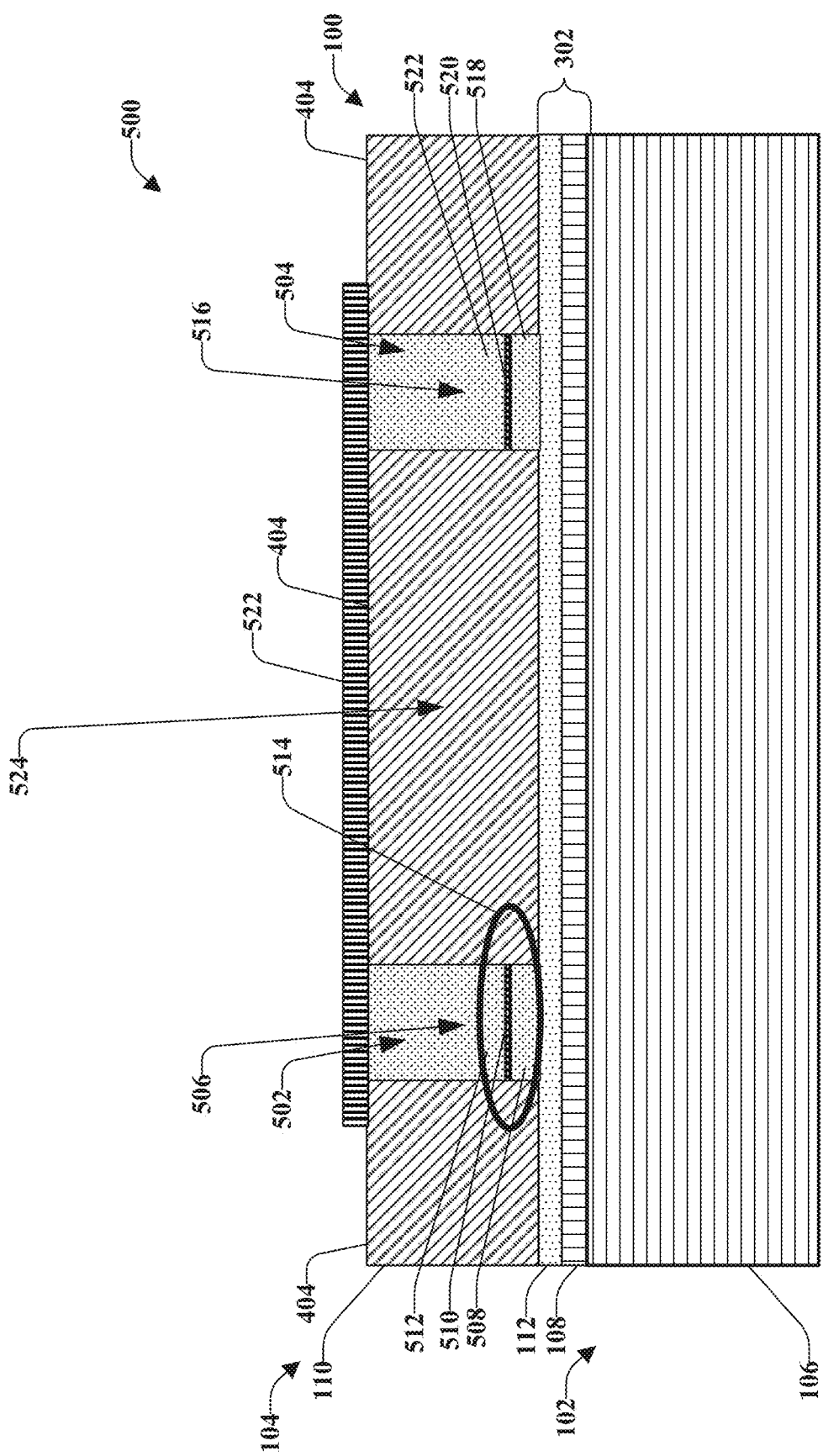
FIG. 5 illustrates an example, non-limiting, side cross-sectional view of a structure of a superconducting quantum interference device during a fabrication process wherein an electrical loop is created in accordance with one or more embodiments described herein.

FIG. 5 illustrates an example, non-limiting, side cross-sectional view of a structure of a superconducting quantum interference device 500 during a fabrication process wherein an electrical loop is created in accordance with one or more embodiments described herein. Repetitive description of like elements employed in other embodiments described herein is omitted for sake of brevity.

Upon or after the thinning down of the second crystalline silicon layer 110, one or more vias can be etched in the second crystalline silicon layer 110. For example, a first via 502 and a second via 504 can be formed at defined areas of the superconducting quantum interference device 500.

The first via 502 and the second via 504 can comprise respective Josephson junctions. For example, the first via 502 can comprise a first Josephson junction 506 that can comprise a first superconductor layer 508, a tunnel barrier layer 510, and a second superconducting layer 512. The first Josephson junction 506 is identified by the oval area 514. Further, the second via 504 can comprise a second Josephson junction 516 that can comprise a first superconductor layer 518, a tunnel barrier layer 520, and a second superconducting layer 522. As illustrated the first Josephson junction 506 and the second Josephson junction 516 can be vertical Josephson junctions.

According to some implementations, the superconducting material utilized for the second superconducting layer 512 can be utilized to fill the first via 502 to the top surface 404 and the superconducting material utilized for the second superconducting layer 522 can be utilized to fill the second via 504 to the top surface 404.

A second superconducting layer 522 can be deposited over the top surface 404 of the second crystalline silicon layer 110. The second superconducting layer 522 can comprise a superconducting metal, which can be a same metal, a similar metal, or a different metal than the metals utilized for the first via 502, the second via 504, the first Josephson junction 506, the second Josephson junction 516, and/or the first superconducting layer 302. Further, the second superconducting layer 504 can be patterned and etched. The second superconducting layer 522 (a top contact) and the first superconducting layer 302 (e.g., a bottom contact) can be utilized to control properties of the superconducting quantum interference device 500, for example An electrical loop can be formed from the first via 502 comprising the first Josephson junction 506, the second via 504 comprising the second Josephson junction 516, the first superconductor layer (e.g., the first superconducting layer 302), and the second superconductor layer (e.g., the second superconducting layer 522). Accordingly, the loop can be formed by superconducting material. The electrical loop can allow for the circulation of supercurrent.

An area of the second crystalline silicon layer 110 (e.g., a defined area 524) can be defined within the electrical loop. For example, the area of the second crystalline silicon layer 110 surrounded by the first via 502 comprising the first Josephson junction 506, the second via 504 comprising the second Josephson junction 516, the first superconductor layer (e.g., the first superconducting layer 302), and the second superconductor layer (e.g., the second superconducting layer 522) can be the defined area 524.

Figure 6:
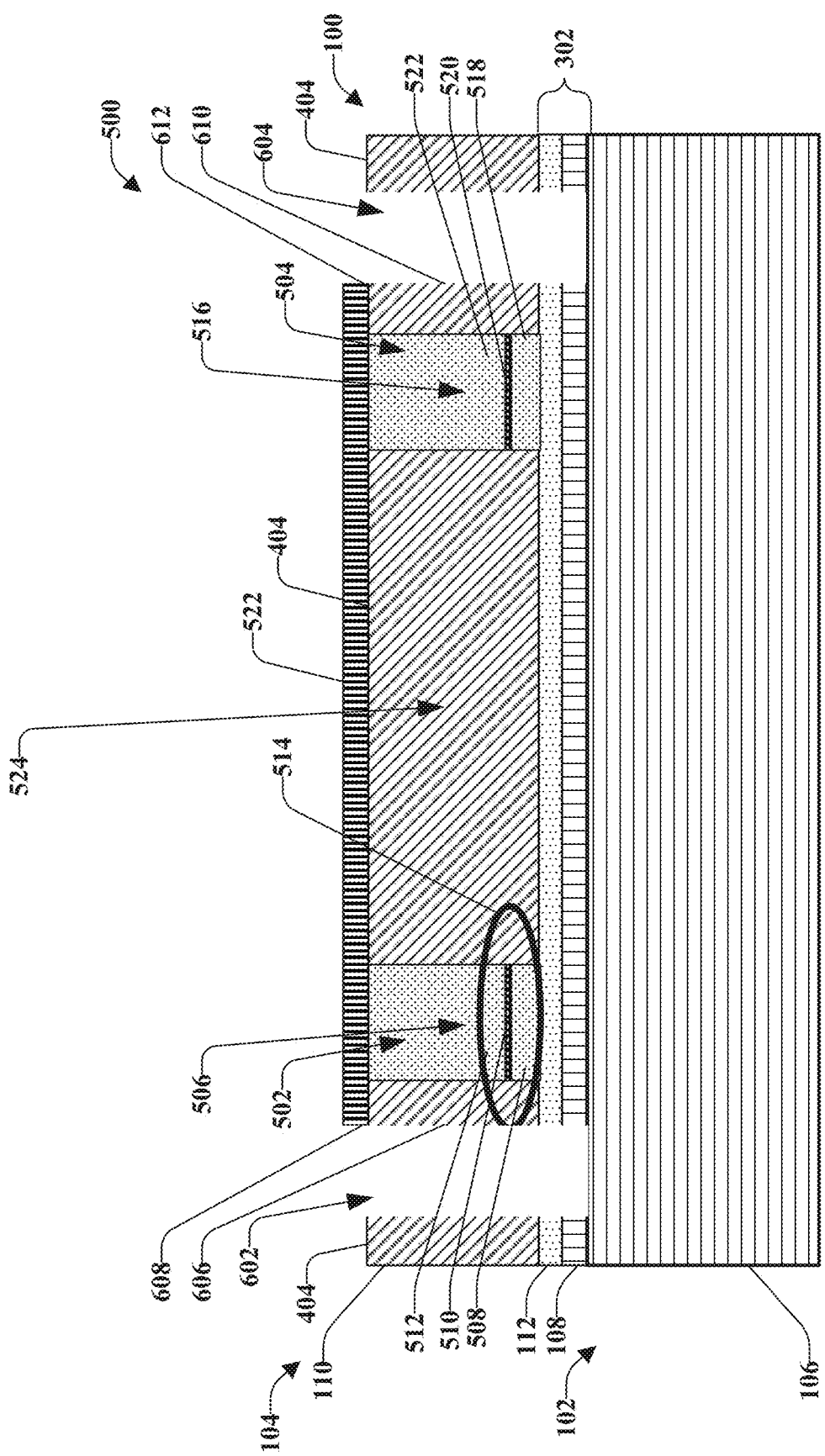
FIG. 6 illustrates an example, non-limiting, side cross-sectional view of the structure of the superconducting quantum interference device of FIG. 5 during a fabrication process wherein one or more trenches are etched in accordance with one or more embodiments described herein.

FIG. 6 illustrates an example, non-limiting, side cross-sectional view of the structure of the superconducting quantum interference device 500 of FIG. 5 during a fabrication process wherein one or more trenches are etched in accordance with one or more embodiments described herein. Repetitive description of like elements employed in other embodiments described herein is omitted for sake of brevity.

As illustrated, a first trench 602 can be etched (e.g., formed) through the second crystalline silicon layer 110 at a first distance from, and adjacent to, the first via 502 comprising the first Josephson junction 506. Further, a second trench 604 can be etched (e.g., formed) through the second crystalline silicon layer 110 at a second distance from, and adjacent to, the second via 504 comprising the second Josephson junction 516. The first trench 602 and the second trench 604 can be utilized to electrically isolate the superconducting quantum interference device 500 from the surrounding region and/or other circuits. The second crystalline silicon layer 110 can be patterned and etched such that the one or more trenches (e.g., the first trench 602 and the second trench 604) penetrate the silicon-on-metal substrate 100.

Figure 7:
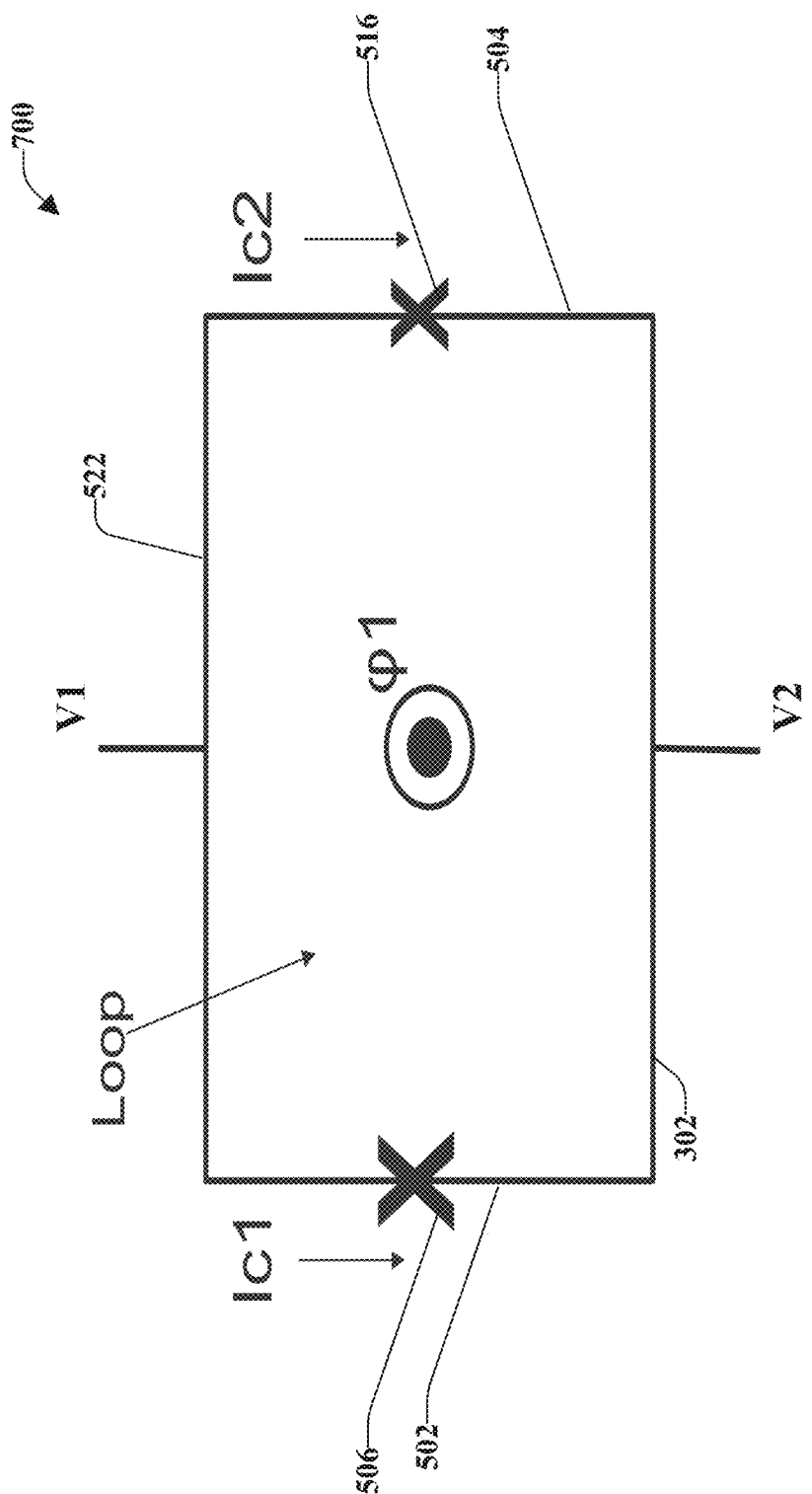
FIG. 7 illustrates an example, non-limiting, electrical schematic diagram of an electrical loop of the superconducting quantum interference device of FIG. 5 in accordance with one or more embodiments described herein.

FIG. 7 illustrates an example, non-limiting, electrical schematic diagram of an electrical loop 700 of the superconducting quantum interference device 500 of FIG. 5 in accordance with one or more embodiments described herein. Repetitive description of like elements employed in other embodiments described herein is omitted for sake of brevity.

For purposes of explanation, the left side of the electrical loop 700 represents the first via 502, wherein the "X" designates the position of the first Josephson junction 506 and the right side of the electrical loop 700 represents the second via 504, wherein the "X" designates the position of the second Josephson junction 516. Further, the bottom of the electrical loop 700 represents the first superconducting layer 302 (e.g., the bottom contact) and the top of the electrical loop 700 represents the second superconducting layer 522 (e.g., the top contact). Thus, the loop can be formed by superconducting material.

The superconducting quantum interference device 500 can comprise two or more Josephson junctions with an enclosed loop. The loop can be biased between two electrical potentials. For example, a first electrical potential (V1) can be applied to a first terminal (e.g., the second superconducting layer 522) and a second electrical potential (V2) can be applied to a second terminal (e.g., the first superconducting layer 302). Thus, the potential difference across the loop is V1-V2, which can happen statically or dynamically, such as at high frequencies.

The total supercurrent flowing through the loop is a sum of a first current flowing through the first Josephson junction 506 plus the second current flowing through the second Josephson junction 516 (Ic1+Ic2). The current flow can be from the first terminal (V1) to the second terminal (V2). An application of a magnetic field perpendicular to the plane of the loop creates a magnetic flux through the loop and can change the supercurrent flowing between the two electrical terminals. The magnetic flux perpendicular to the page (and loop) and coming out of it is φ1.

Figure 8:
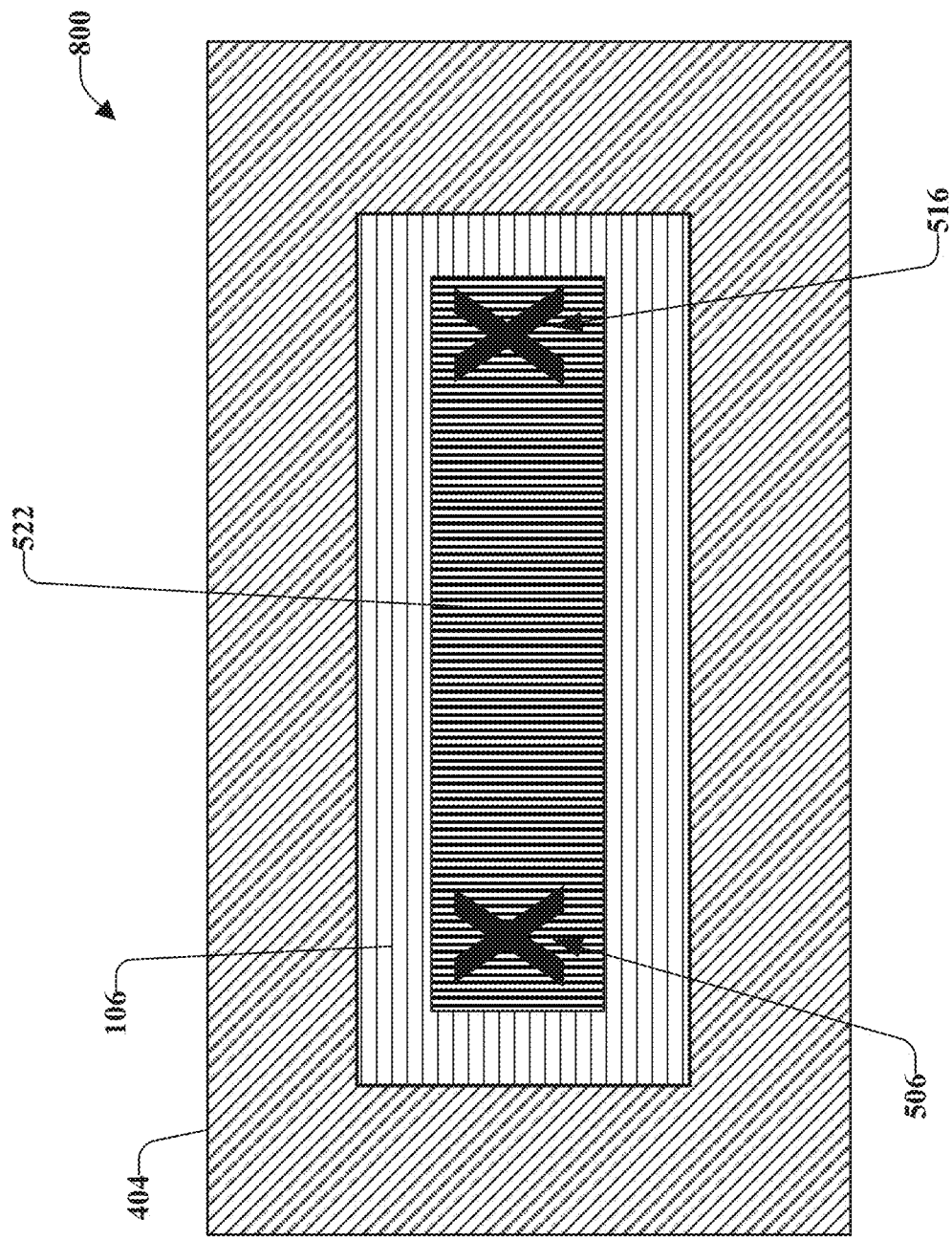
FIG. 8 illustrates an example, non-limiting, top view of the structure of a first embodiment of the electrical loop of the superconducting quantum interference device of FIG. 5 in accordance with one or more embodiments described herein.
Figure 9:
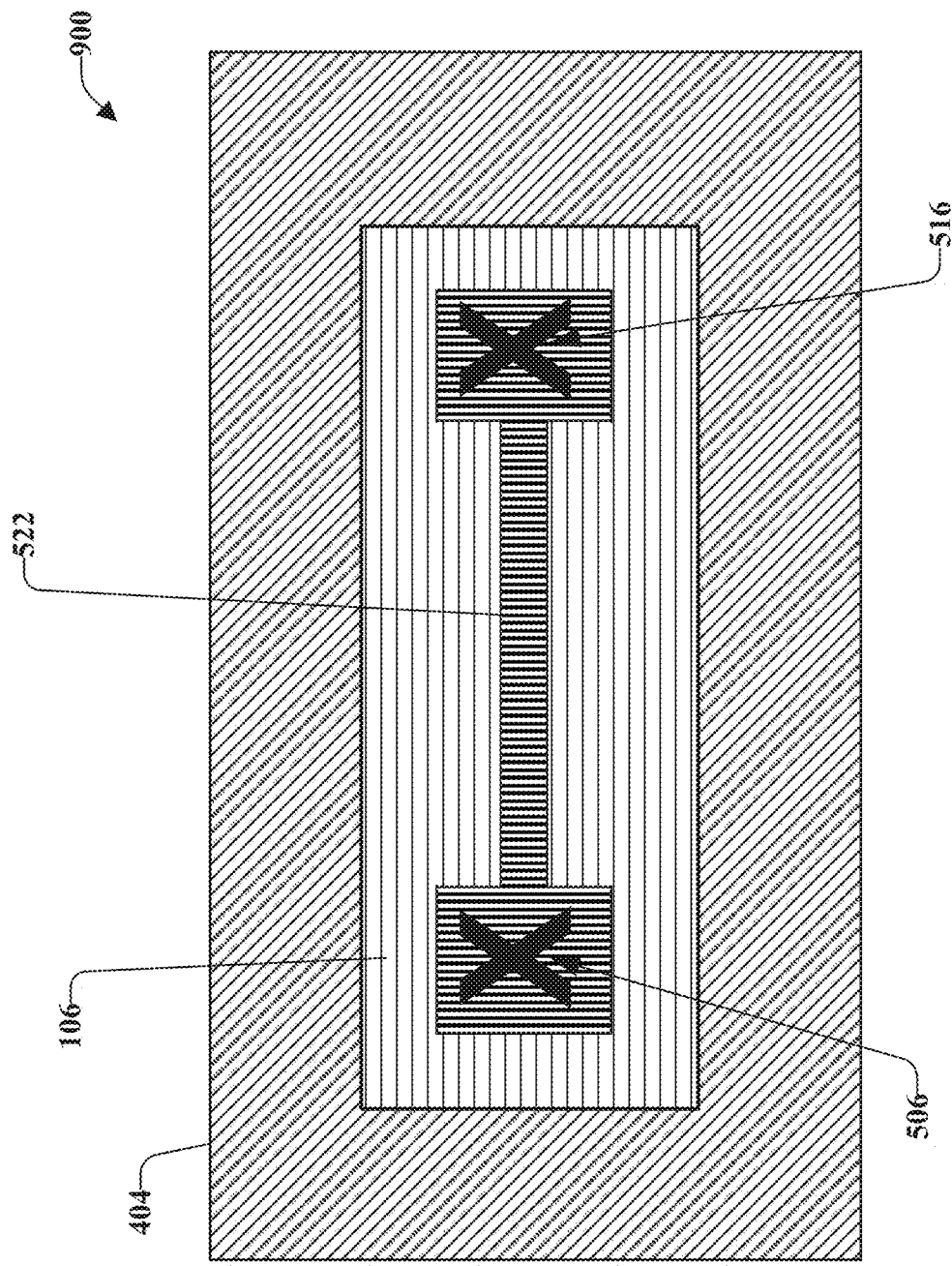
FIG. 9 illustrates an example, non-limiting, top view of the structure of a second embodiment of the electrical loop of the superconducting quantum interference device of FIG. 5 in accordance with one or more embodiments described herein.

FIG. 8 illustrates an example, non-limiting, top view of the structure of a first embodiment 800 of the electrical loop of the superconducting quantum interference device 500 of FIG. 5 in accordance with one or more embodiments described herein. FIG. 9 illustrates an example, non-limiting, top view of the structure of a second embodiment 900 of the electrical loop of the superconducting quantum interference device 500 of FIG. 5 in accordance with one or more embodiments described herein. Repetitive description of like elements employed in other embodiments described herein is omitted for sake of brevity.

It is noted that FIG. 7 and FIG. 8 do not provide an indication of how contact is made to the top metal (e.g., the second superconducting layer 522) and the bottom metal (e.g., the first superconducting layer 302) in the structures. In addition, the two areas marked by "X" indicate the location of the respective Josephson junctions within the vias. Thus, under the areas marked by "X" is where the tunnel barriers (e.g., the tunnel barrier layer 510, the tunnel barrier layer 520) exist. The "X" does not form a part of the structure of the superconducting quantum interference device 500 but is provided for purposes of explaining the various aspects provided herein.

As illustrated, in the first embodiment 700 of FIG. 7, the second superconducting layer 522 can comprise a configuration wherein the top layer, including the portions over the one or more vias (e.g., the first via 502 and the second via 504) are substantially the same shape, width and length. However, other configurations can be utilized, such as the second embodiment 900 of FIG. 9, wherein the second superconducting layer 522 is formed in a "dumbbell" type shape. In the second embodiment, a portion of the second superconducting layer 522 between the one or more vias is thinner than (e.g., not as wide as) other portions of the second superconducting layer 522 over the one or more vias.

Thus, as illustrated in FIG. 7 and FIG. 8, the electrical loop can be shaped differently. It is noted that the one of more Josephson junctions that comprise the tunnel barrier, in cross section, can be designed to be a defined dimension. However, other elements of the electrical loop can be modified. Further, other variations for the shape of the electrical loop can be employed in accordance with various aspects, while maintaining the one or more tunnel barriers at the defined dimension.

With reference again to FIG. 6, although illustrated with a first area 606 of the second crystalline silicon layer 110 and a first section 608 of the second superconducting layer 522 between the first via 502 and the first trench 602 and a second area 610 of the second crystalline silicon layer 110 and a second section 612 of the second superconducting layer 522 between the second via 504 and the second trench 604, the disclosed aspects are not limited to this implementation.

Figure 10:
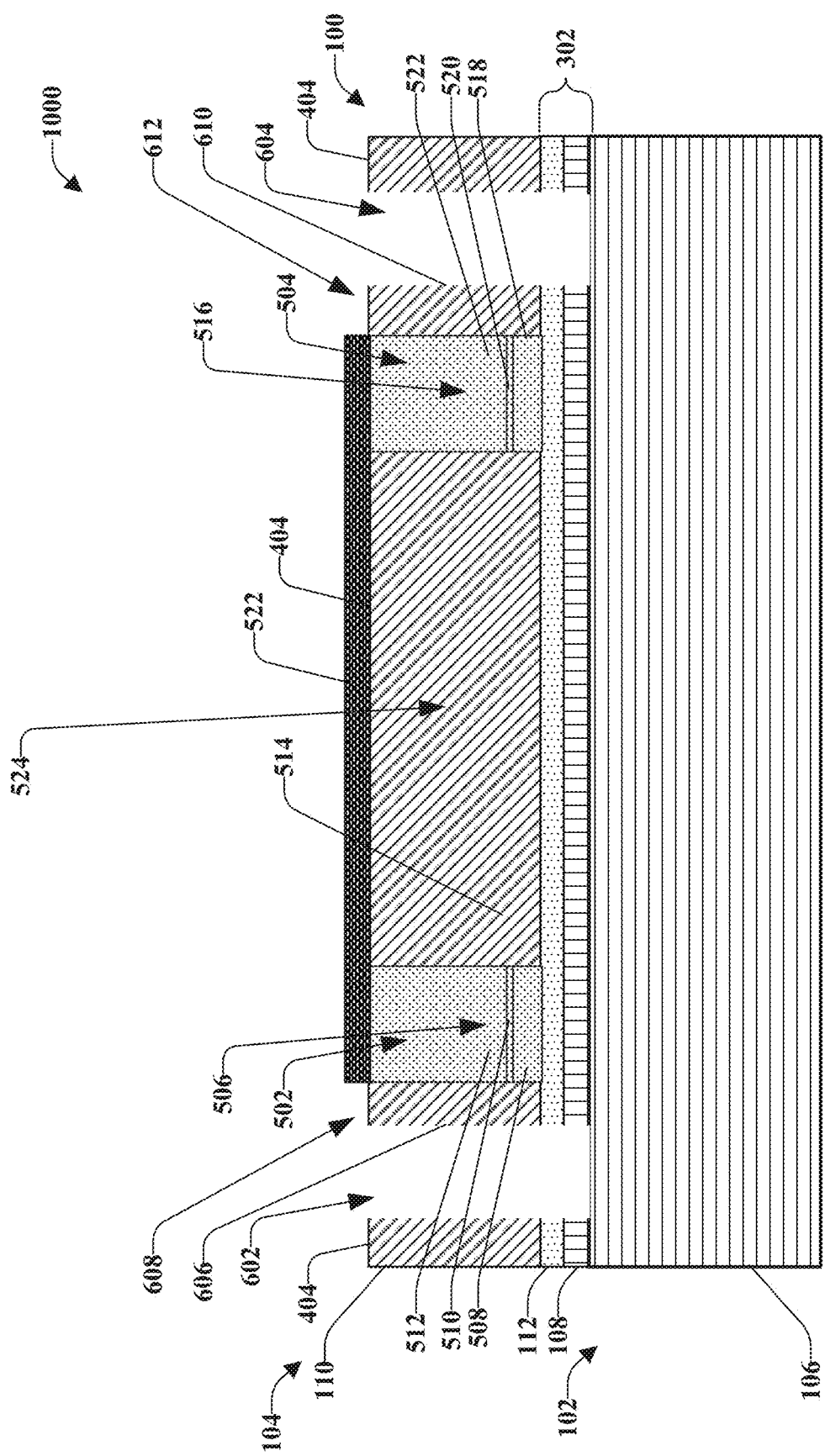
FIG. 10 illustrates an example, non-limiting, side cross-sectional view of a structure of another superconducting quantum interference device during a fabrication process wherein one or more portions of a second superconducting layer are removed in accordance with one or more embodiments described herein.

FIG. 10 illustrates an example, non-limiting, side cross-sectional view of a structure of another superconducting quantum interference device 1000 during a fabrication process wherein one or more portions of a second superconducting layer are removed in accordance with one or more embodiments described herein. Repetitive description of like elements employed in other embodiments described herein is omitted for sake of brevity.

In the embodiment of FIG. 10, the first section 608 of the second superconducting layer 522 between the first via 502 and the first trench 602 and second section 612 of the second superconducting layer 522 between the second via 504 and the second trench 604 can be removed. Accordingly, the area of the second superconducting layer 522 overhanging on either side of the first via 502 and the second via 504 can be removed. Thus, the top superconducting metal (e.g., the second superconducting layer 522) does not extend beyond the vias (e.g., the first via 502 and the second via 504). It is noted that in the example of FIG. 10, the silicon on either side (e.g., the first area 606 and the second area 610 of the second crystalline silicon layer 110) remains next to the first via 502 (e.g., the first Josephson junction 506) and the second via 504 (e.g., the second Josephson junction 516).

Further, the disclosed aspects are not limited to the examples illustrated in FIG. 6 and FIG. 10. In some implementations, the first area 606 of the second crystalline silicon layer 110 between the first via 502 and the first trench 602 and the second area 610 of the second crystalline silicon layer 110 between the second via 504 and the second trench 604 can also be removed. For example, at substantially the same time, the first section 608 and first area 606 can be removed, and the second section 612 and the second area 610 can be removed. Thus, the second superconducting layer and respective portions of the second crystalline silicon layer 110 can be etched flush with the respective edges of the one or more vias (e.g., the first via 502 and the second via 504).

According to this implementation, respective sides (e.g., one side) of the one or more Josephson junctions can be exposed. For example, one side of the first Josephson junction 506 can be exposed by the first trench 602 and one side of the second Josephson junction 516 can be exposed by the second trench 604.

Advantages of retaining the silicon (e.g., the first area 606 and/or the second area 610 of the second crystalline silicon layer 110) includes not exposing the structure (e.g., the electrical loop) that includes the one or more Josephson junctions (e.g., the first Josephson junction 506 and the second Josephson junction 516) to air. Another advantage of retaining the silicon can be to prevent the one or more Josephson junctions and/or other elements of the electrical loop from being oxidized and/or from being chemically modified.

According to some implementations, there can be multiple superconducting quantum interference devices located on a chip. Thus, if the superconducting quantum interference devices should not be at the same electrical potential, one or more superconducting quantum interference devices can be electrically isolated from one another by etching the respective areas around the superconducting quantum interference devices (e.g., the first trench 602 and the second trench 604). Additionally, or alternatively, as discussed herein the top terminal (e.g., the second superconducting layer 522) and the bottom terminal (e.g., the first superconducting layer 302) are discussed as different terminals. However, one of the terminals could be a common terminal for other circuits. For example, a terminal could be a ground terminal for the other circuits and, thus, is not electrically isolated from the other circuits. However, to make the circuits isolated from one another, the etched areas are formed on either side of the superconducting quantum interference device.

Figure 11:
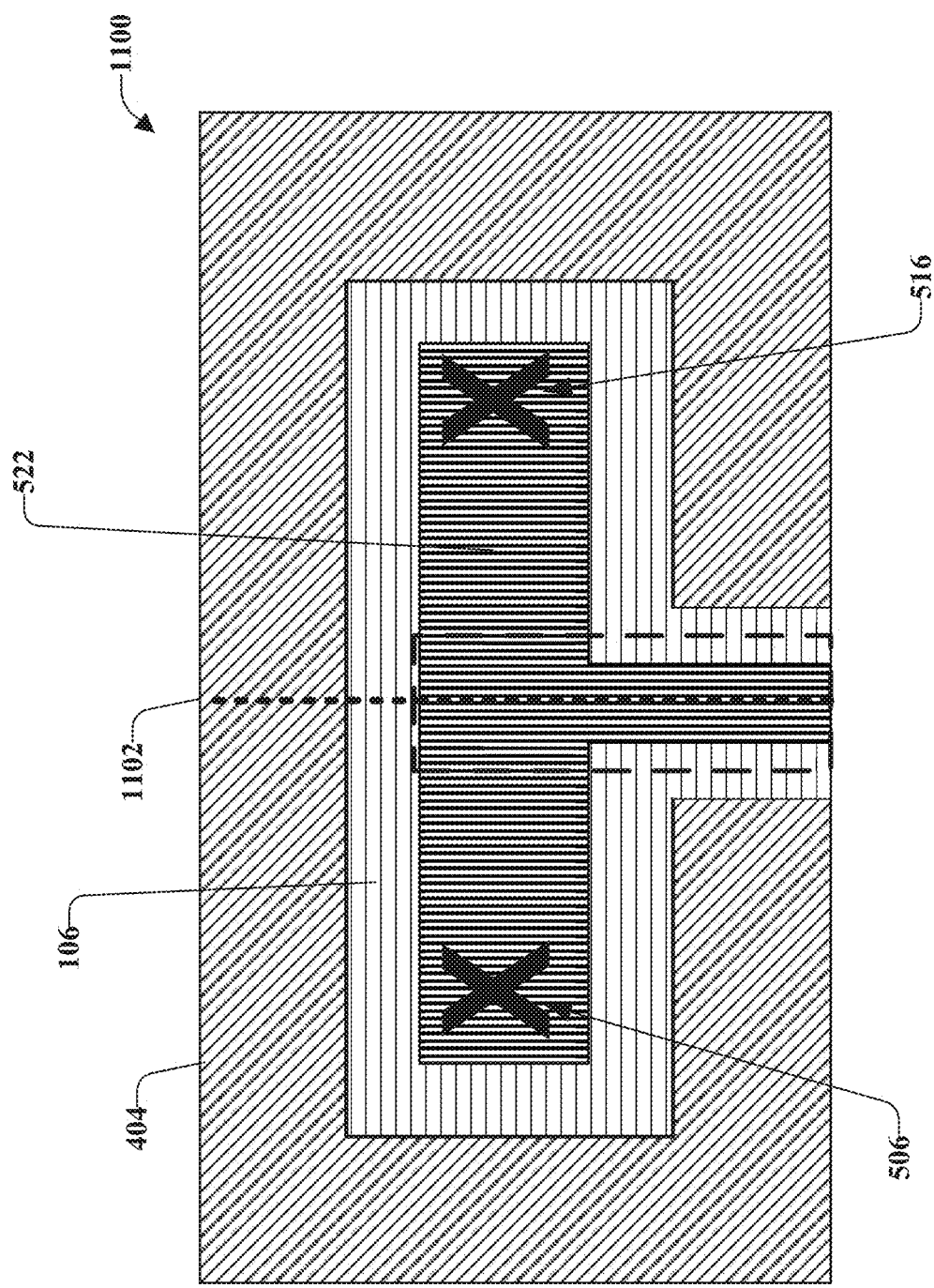
FIG. 11 illustrates an example, non-limiting, top view of a biasing circuit for connecting a superconducting quantum interference device through a top and bottom superconducting layer in accordance with one or more embodiments described herein.
Figure 12:
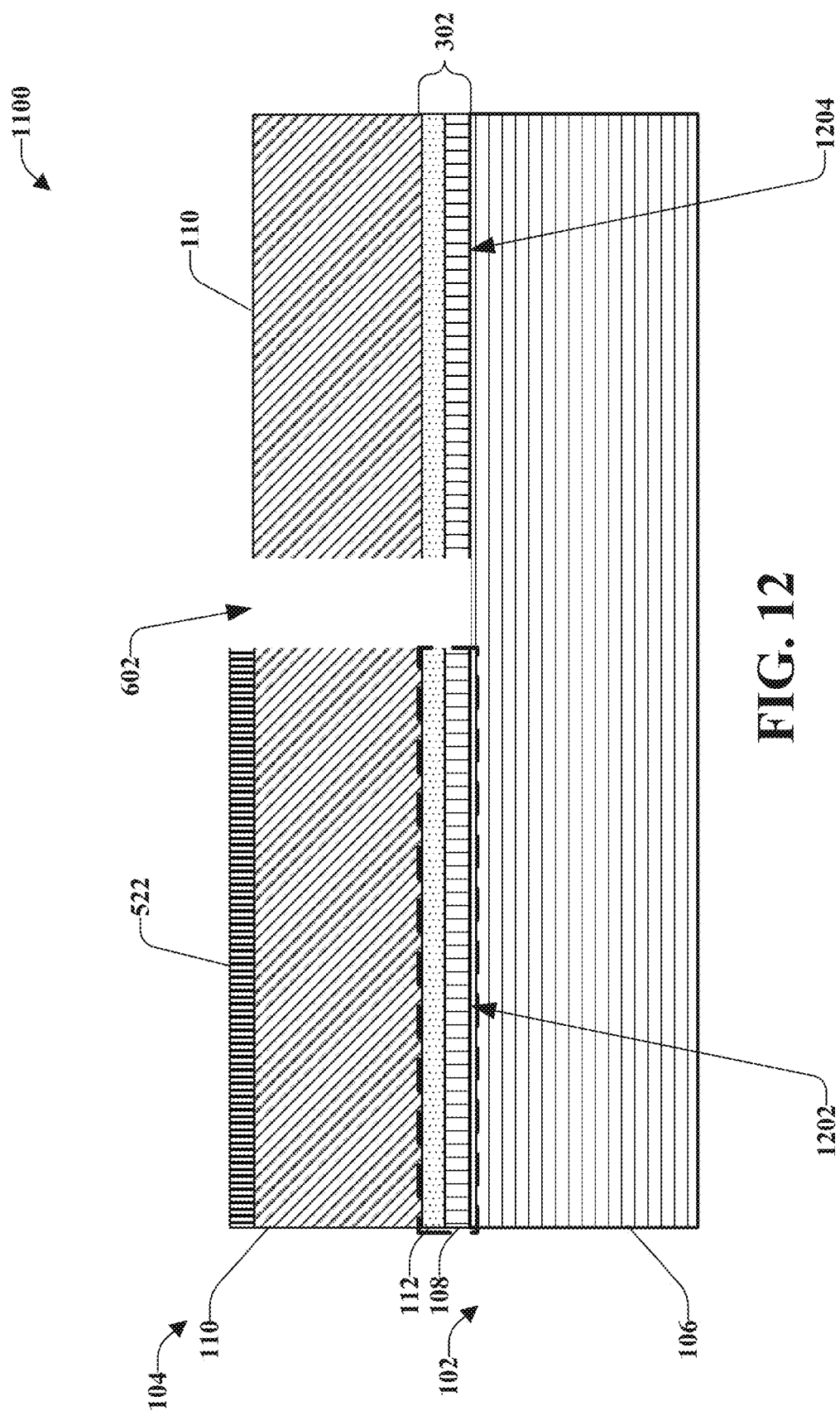
FIG. 12 illustrates an example, non-limiting, side cross-sectional view of the biasing circuit of FIG. 11 in accordance with one or more embodiments described herein.

FIG. 11 illustrates an example, non-limiting, top view of a biasing circuit 1100 for connecting a superconducting quantum interference device through a top and bottom superconducting layer in accordance with one or more embodiments described herein. FIG. 12 illustrates an example, non-limiting, side cross-sectional view of the biasing circuit 1100 of FIG. 11 in accordance with one or more embodiments described herein. Repetitive description of like elements employed in other embodiments described herein is omitted for sake of brevity.

In the embodiments where the superconducting quantum interference device is isolated from surrounding circuits, to isolate the bottom contact (e.g., the first superconducting layer 302), material around the bottom contact can be etched away. However, once the material is etched (e.g., removed), at every place where there is a top contact (e.g., the second superconducting layer 522), there is a corresponding bottom contact underneath. For example, in order to gain access to the bottom contact, the device has to be etched from the top contact (e.g., the second superconducting layer 522) down to the bottom contact (e.g., through the second crystalline silicon layer 110).

The dashed line 1102 in FIG. 11 represents the side cross-sectional area of FIG. 12, which is through the middle of the electrical loop. Therefore, as illustrated in FIG. 12, the second superconducting layer 522 on the top surface 404 has a corresponding first superconducting layer 302 on the bottom. After the trench (e.g., the first trench 602) is etched, the first superconducting layer 302 has two portions, illustrated as a first superconducting layer portion 1202 (illustrated to the left of the first trench 602) and a second first superconducting layer portion 1204 (illustrated to the right of the first trench 602).

Figure 13:
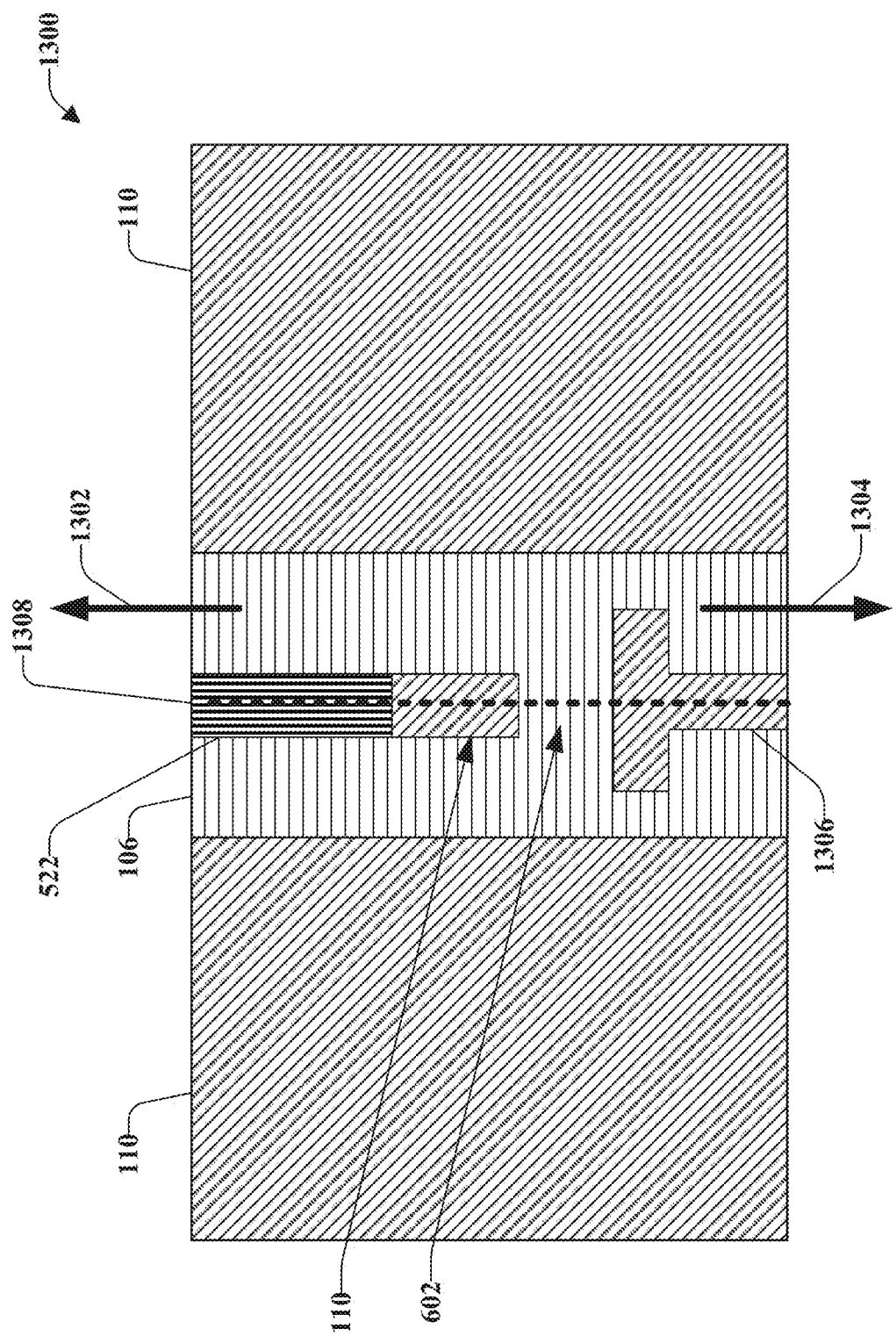
FIG. 13 illustrates an example, non-limiting, top view of another biasing circuit for creating a transmon qubit utilizing superconducting quantum interference device in accordance with one or more embodiments described herein.
Figure 14:
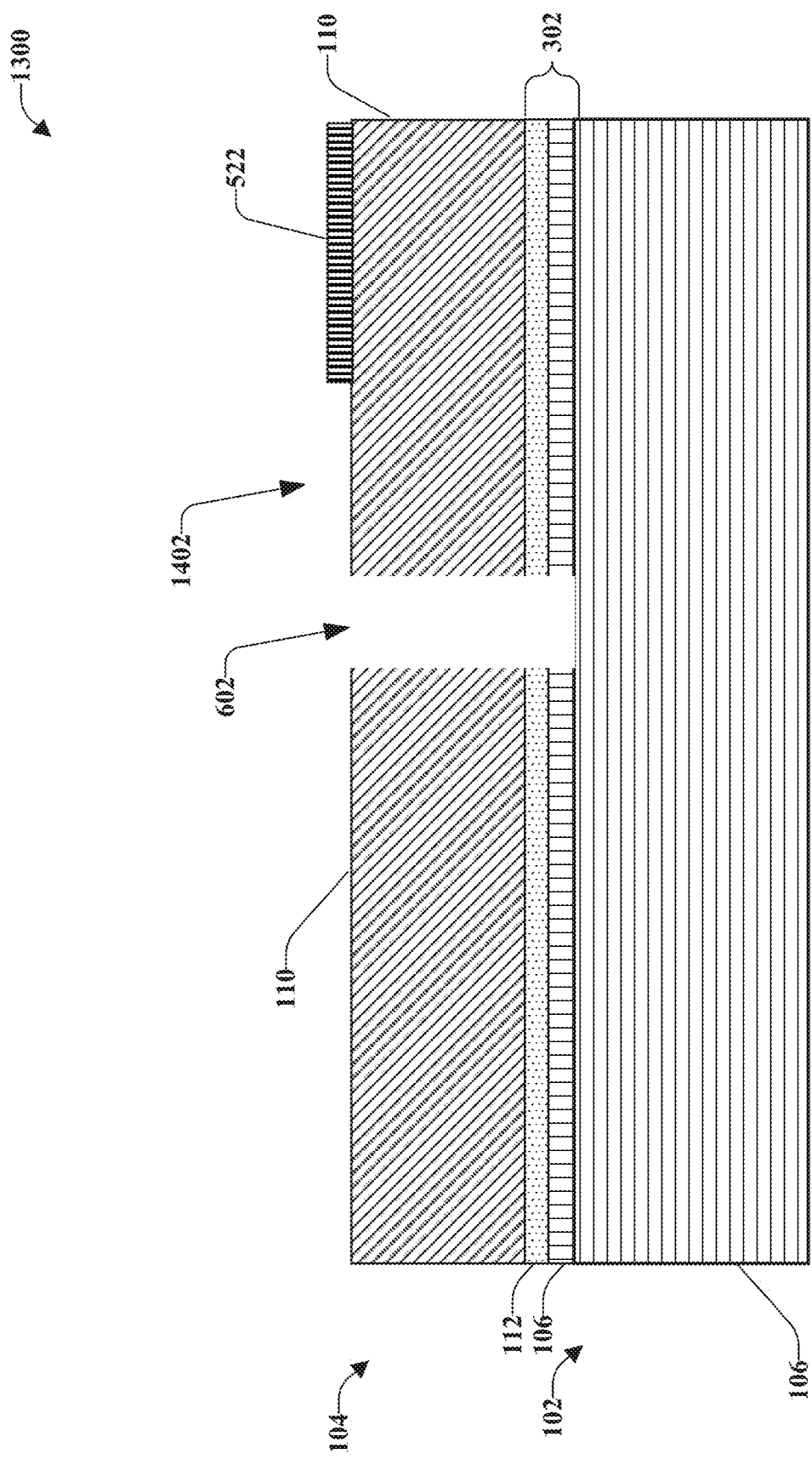
FIG. 14 illustrates an example, non-limiting, side cross-sectional view of the biasing circuit of FIG. 13 in accordance with one or more embodiments described herein.

FIG. 13 illustrates an example, non-limiting, top view of another biasing circuit 1300 for creating a transmon qubit utilizing a superconducting quantum interference device in accordance with one or more embodiments described herein. FIG. 14 illustrates an example, non-limiting, side cross-sectional view of the biasing circuit 1300 of FIG. 13 in accordance with one or more embodiments described herein. Repetitive description of like elements employed in other embodiments described herein is omitted for sake of brevity.

The first arrow 1302 of FIG. 13 points towards the superconducting quantum interference device (e.g., toward the bottom of the dashed line 1102) and the second arrow 1304 points towards an interconnect or readout resonator. A transmon with superconducting quantum interference device can use wiring or parallel plates at the end to provide a shunting capacitance, and asymmetric capacitive coupling to resonators using different lengths (of the wires or parallel plates). In the example of FIGS. 13 and 14, the coupling is stronger between the bottom wire of the qubit and the interconnect or readout resonator through a coupling capacitor 1306. In this embodiment, a transmon qubit can be created that comprises a shunting capacitor (e.g., between the second superconducting layer 522 and the first superconducting layer 302 underneath the second crystalline silicon layer 110) in conjunction with the Josephson junction. In some embodiments, the shunting capacitor can be utilized in conjunction with two Josephson junctions.

Beginning from the bottom of the dashed line 1102 in FIG. 11 and extending away from the loop and into the top of dashed line 1308 of FIG. 13, the shunting capacitor ends where there is an etch that disconnects the shunting capacitor from another circuit through the dashed line. Accordingly, in an example embodiment, to make the capacitance different, a portion of the second superconducting layer, indicated at 1402, can be removed. Therefore, there is an area of the first superconducting layer 302, near the superconducting quantum interference device side, that does not have a corresponding second superconducting layer above it. Thus, the top contact (e.g., the second superconducting layer 522) and the first superconducting layer 302 on the superconducting quantum interference device side of the first trench 602 can comprise different lengths.

Figure 15:
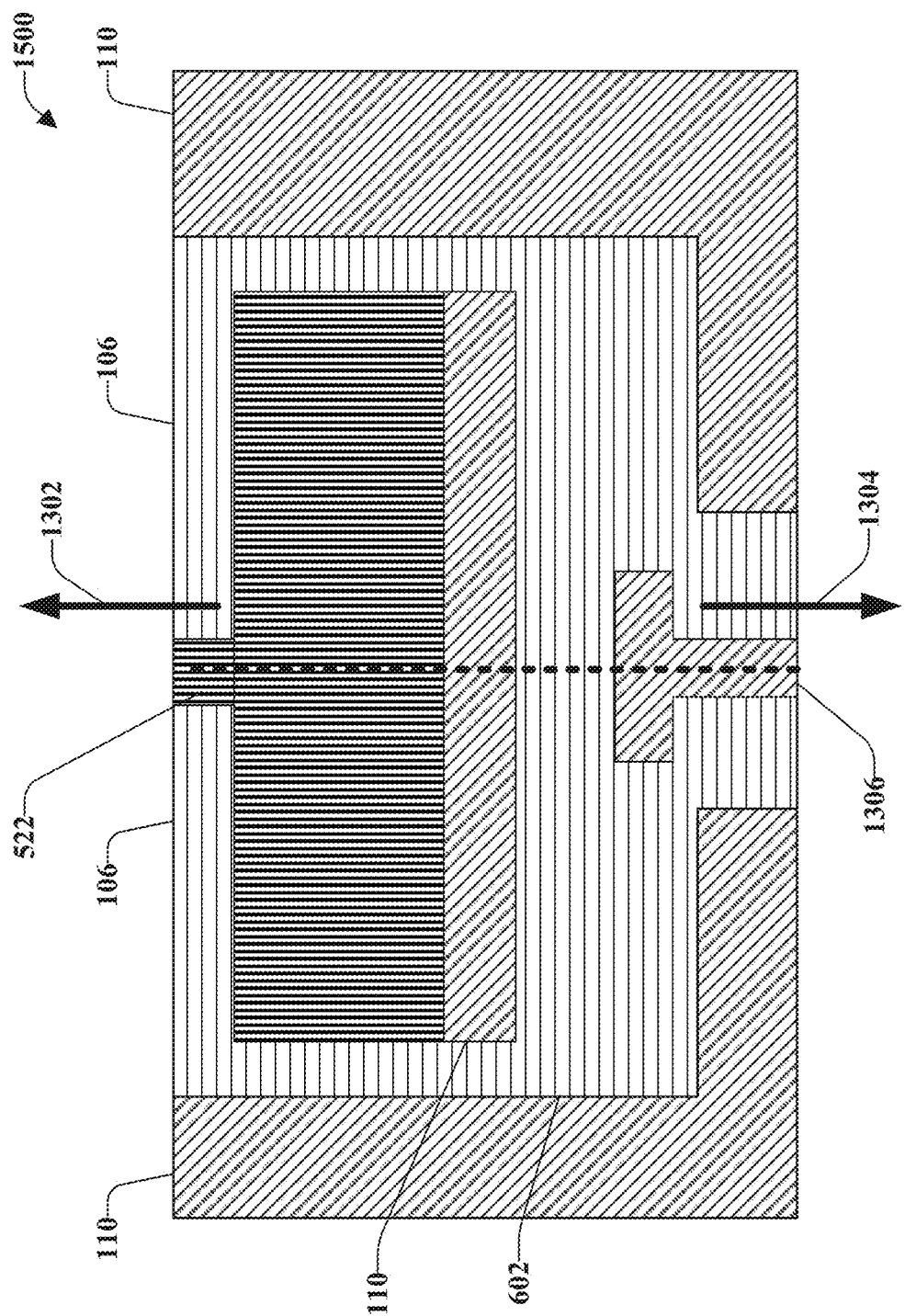
FIG. 15 illustrates an example, non-limiting, top view of a further biasing circuit for a superconducting quantum interference device in accordance with one or more embodiments described herein.
Figure 16:
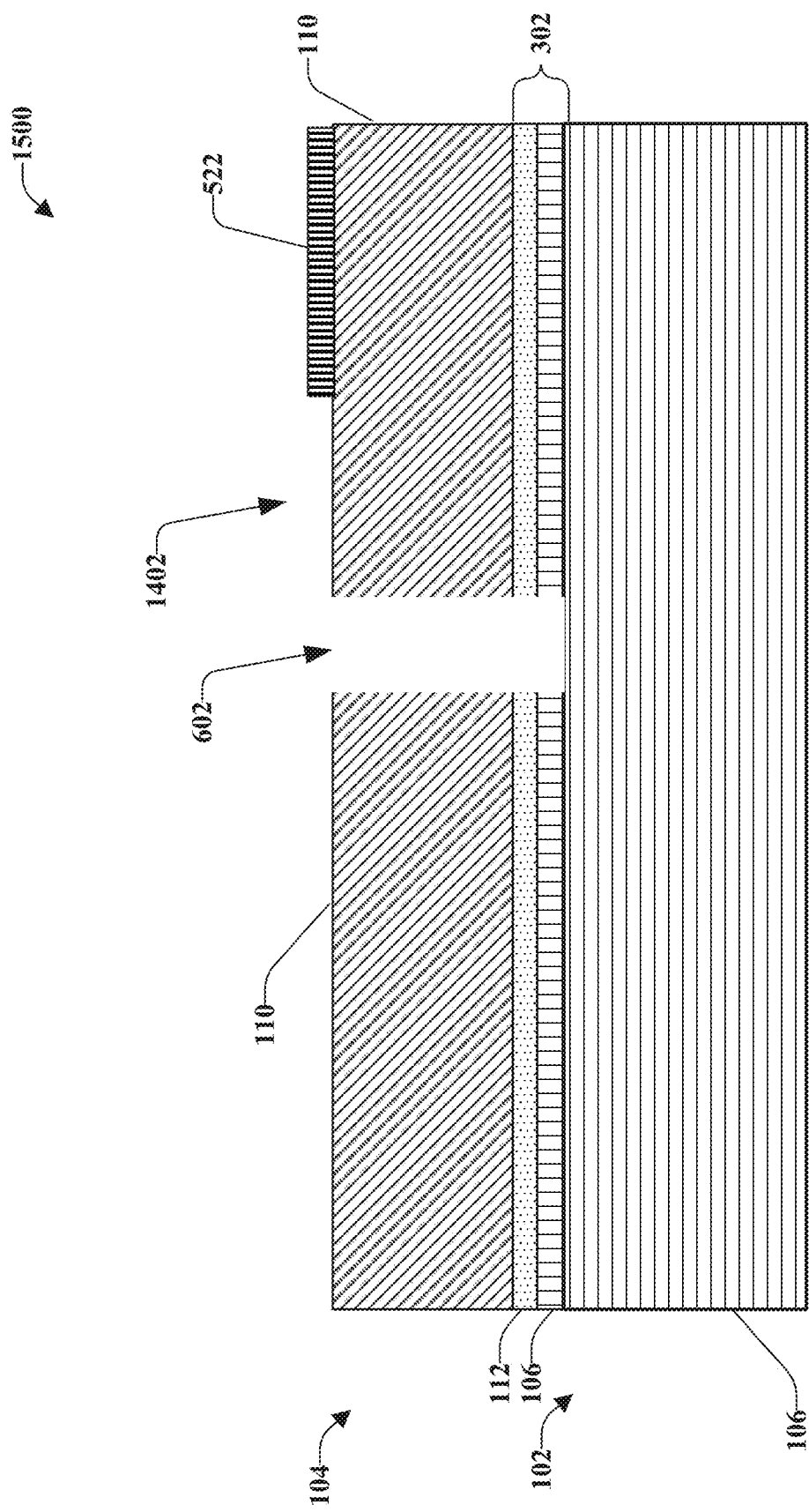
FIG. 16 illustrates an example, non-limiting, side cross-sectional view of the biasing circuit of FIG. 15 in accordance with one or more embodiments described herein.

FIG. 15 illustrates an example, non-limiting, top view of a further biasing circuit 1500 for a superconducting quantum interference device in accordance with one or more embodiments described herein. FIG. 16 illustrates an example, non-limiting, side cross-sectional view of the biasing circuit 1500 of FIG. 15 in accordance with one or more embodiments described herein. Repetitive description of like elements employed in other embodiments described herein is omitted for sake of brevity.

The biasing circuit 1500 is a variation wherein a shape of the termination is changed. The shunting capacitor can be made into a parallel plate capacitor, which can have a variety of shapes (e.g., rectangles, circles, lines, and so on). Two different layers can be utilized to make a capacitor by changing the shape on the top layer (e.g., the second superconducting layer 522). Making the shape slightly different can allow for different coupling to the outside circuits.

In this example, the transmon with superconducting quantum interference device can use wiring or parallel plates at the end for the capacitance, and asymmetric capacitive coupling to resonators using different lengths (of the wires or parallel plates). In the example of FIG. 15 and FIG. 16, coupling is stronger between the bottom wire of the qubit and the interconnect or readout resonator through a coupling capacitor 1306. The shunting capacitor is illustrated as a rectangular shape on both top and bottom to increase total capacitance.

Figure 17:
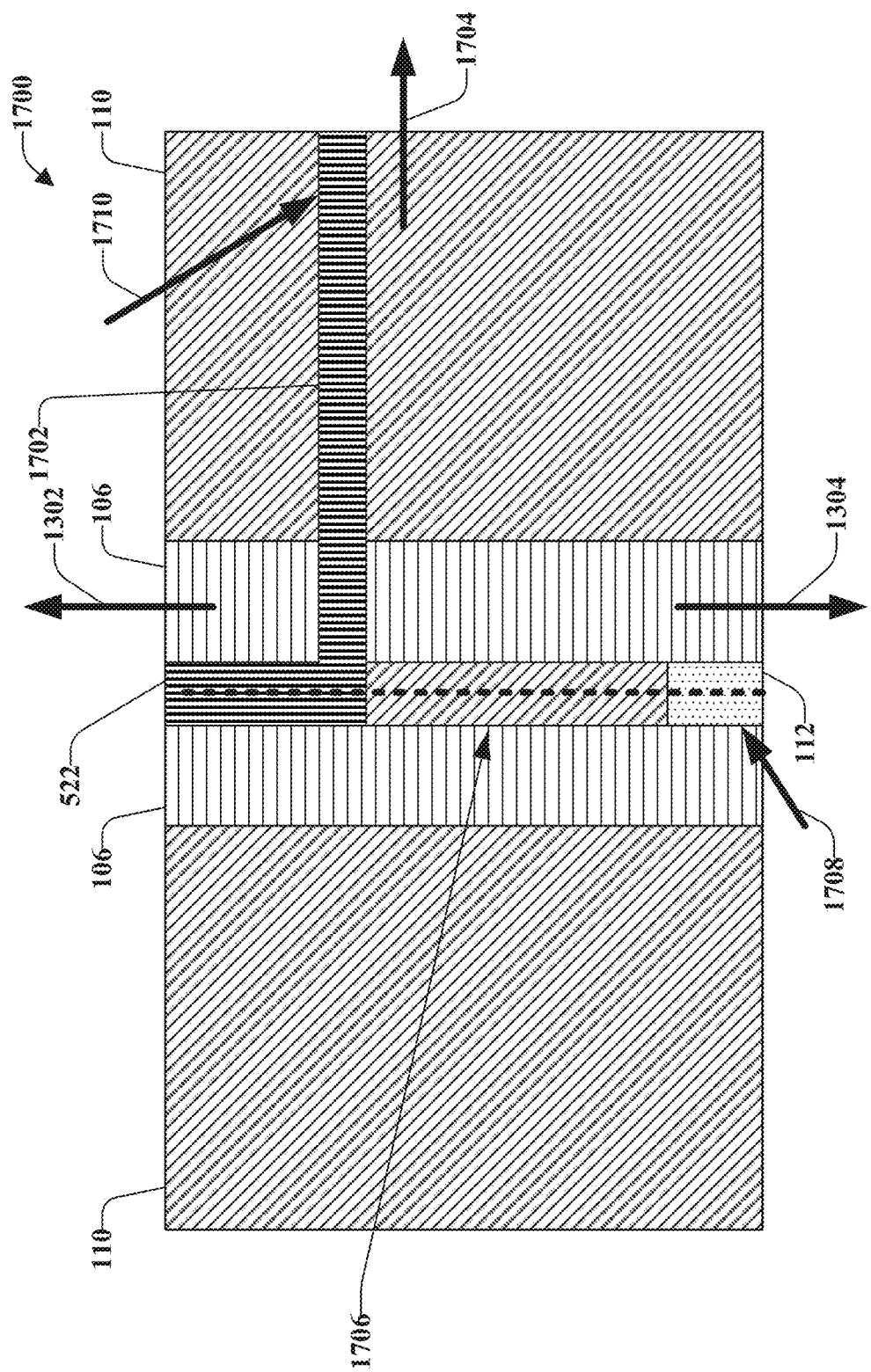
FIG. 17 illustrates an example, non-limiting, top view of another biasing circuit for a superconducting quantum interference device in accordance with one or more embodiments described herein.
Figure 18:
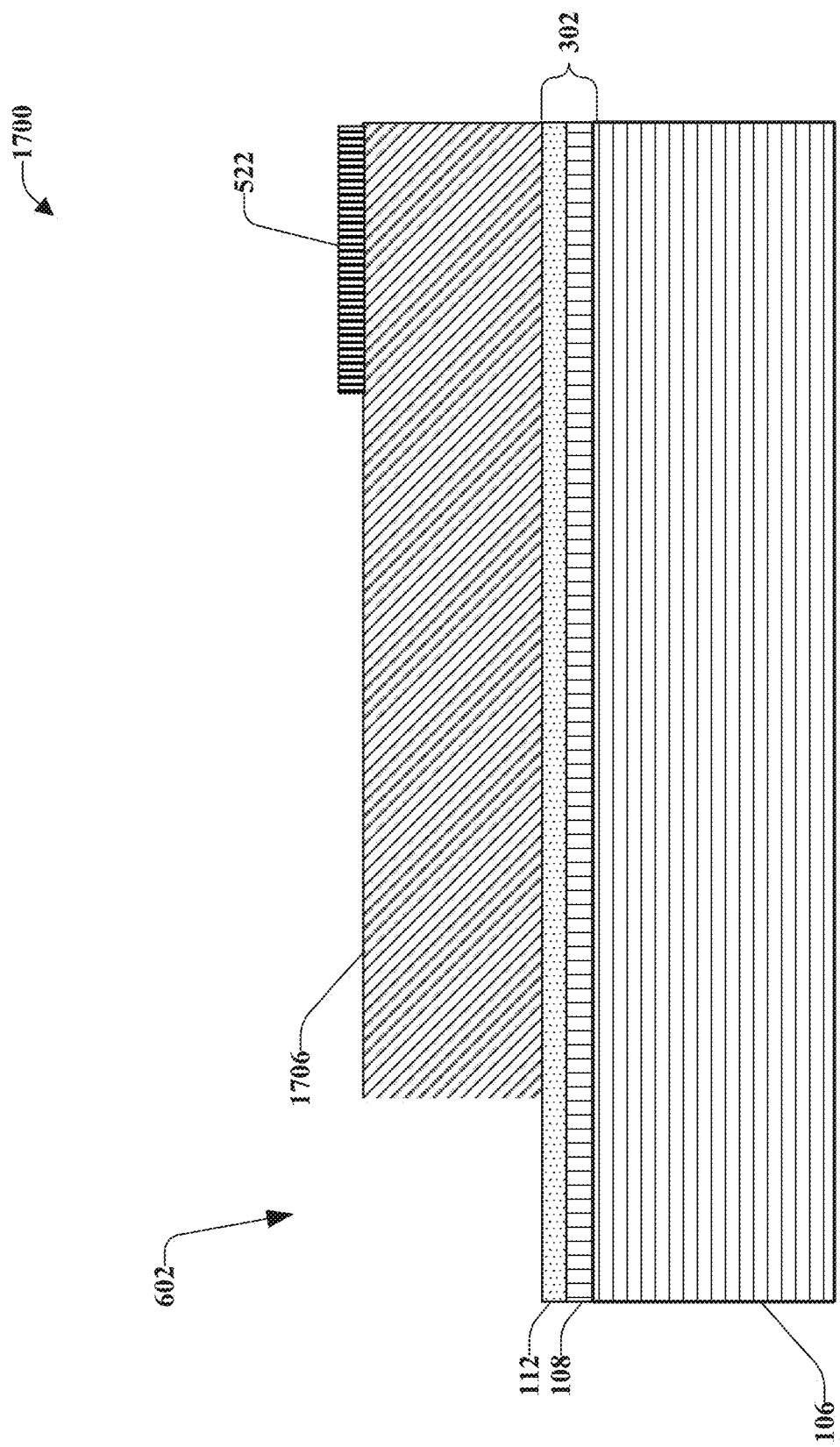
FIG. 18 illustrates an example, non-limiting, side cross-sectional view of the biasing circuit of FIG. 17 in accordance with one or more embodiments described herein.

FIG. 17 illustrates an example, non-limiting, top view of another biasing circuit 1700 for a superconducting quantum interference device in accordance with one or more embodiments described herein. FIG. 18 illustrates an example, non-limiting, side cross-sectional view of the biasing circuit 1700 of FIG. 17 in accordance with one or more embodiments described herein. Repetitive description of like elements employed in other embodiments described herein is omitted for sake of brevity.

The biasing circuit 1700 can be utilized for a superconducting quantum interference device embodiment (e.g., not necessarily for use as a qubit) and, thus, is a superconducting quantum interference device specific embodiment. In this case, the top and bottom wires can be separated in order to make a contact to the wires for biasing the loop. This can be accomplished by bonding (e.g., wire bond, bump bond) or probing.

A wire (e.g., a piece of metal 1702, which can be superconducting metal) can be deposited to provide a pad for bonding and/or probing. The arrow 1704 is pointing towards the pad for bonding and/or probing. The piece of metal 1702 can be made in different configurations, such as wider in one or more places such that a probe can be placed directly on it for biasing.

Silicon 1706 (from the second crystalline silicon layer 110) can remain on top of the indicated section for surface protection against oxidation, according to some implementations. Further, provided is a bottom loop contact 1708 and a top loop contact 1710. Thus, there can be access to the top layer (e.g., the second superconducting layer 522) and access to the bottom layer (e.g., the first superconducting layer 302 or the second superconducting metal 112). In such a manner, an electrical bias can be placed on the bottom loop contact 1708 and the top loop contact 1710 (e.g., a bias between the two terminals of the superconducting quantum interference device).

Figure 19:
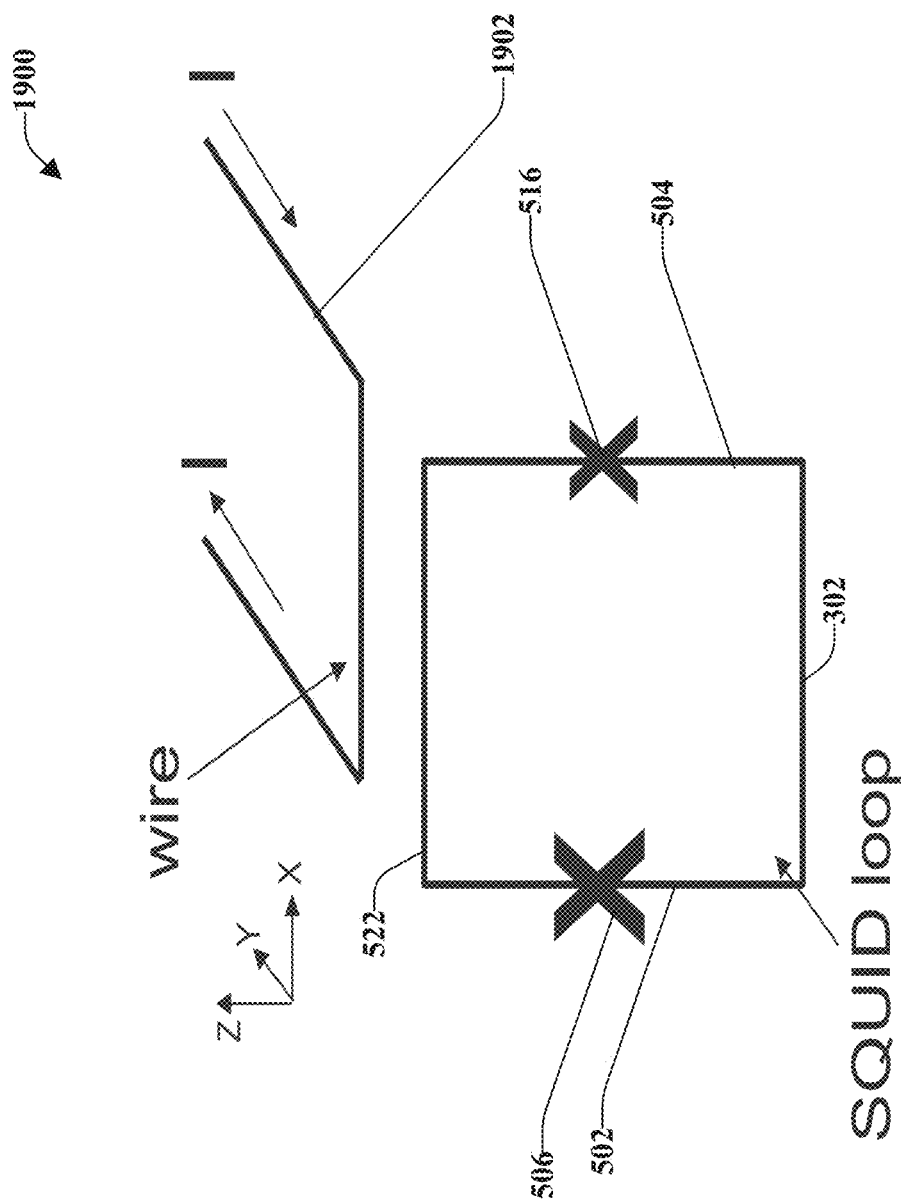
FIG. 19 illustrates an example, non-limiting, electrical schematic diagram of a first embodiment of flux control with a single wire in accordance with one or more embodiments described herein.
Figure 20:
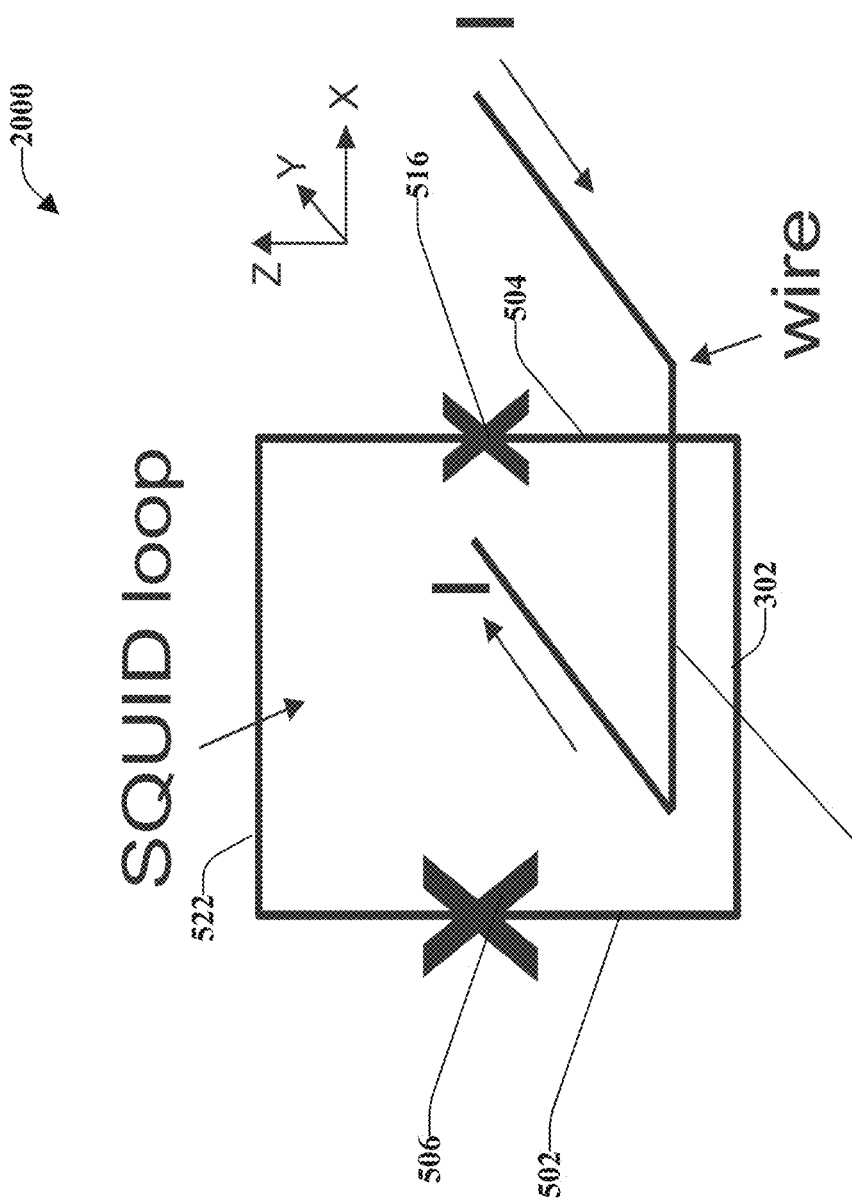
FIG. 20 illustrates an example, non-limiting, electrical schematic diagram of a second embodiment of flux control with a single wire in accordance with one or more embodiments described herein.

FIG. 19 illustrates an example, non-limiting, electrical schematic diagram of a first embodiment of flux control with a single wire 1900 in accordance with one or more embodiments described herein. FIG. 20 illustrates an example, non-limiting, electrical schematic diagram of a second embodiment of flux control with a single wire 2000 in accordance with one or more embodiments described herein. Repetitive description of like elements employed in other embodiments described herein is omitted for sake of brevity.

To exert flux control, if there is a current flowing through a wire, the current generates a magnetic field around the wire. Given a defined distance from the wire, the magnetic field has a given magnitude (usually a constant for a given distance). That magnitude can be constant around a circle around the loop. While looking into a cross-sectional cut through the wire, a circle around the center of the wire would have a magnetic field flowing around that circle. Some of the magnetic field can be intercepted if there is a plane near it (e.g., some of the magnetic field gets intercepted into that plane; the component of that field that is perpendicular to that plane is the relevant quantity for those skilled in the art). One way for exerting magnetic flux control is to pass a current through a wire next to the plane. Thus, there is a superconducting quantum interference device loop, which can be vertical on the left, and there is a wire 1902 with coordinates X, Y, and Z. The superconducting quantum interference device loop is mostly contained in the X and Z plane of the coordinate system. The wire 1902 can be completely contained in the X and Y plane. In FIG. 19, the wire 1902 is drawn close to the superconducting quantum interference device loop in the Y direction. Therefore, the portion of the wire 1902 that is parallel to the top of the superconducting quantum interference device loop (e.g., near the second superconducting layer 522) generates a magnetic field that penetrates the area of the SQUID loop. This would be a source of the magnetic flux through the SQUID loop and this would be the purpose of the wire that is put there. FIG. 20 illustrates a similar situation where the wire 2002 is drawn near the bottom of the superconducting quantum interference device loop.

As indicated, the current (I) through the wire (e.g., the wire 1902, the wire 2002) produces a circular magnetic field around the wire. The magnetic field from the wire threads the superconducting quantum interference device loop, producing the magnetic flux $\varphi 1$ through the superconducting quantum interference device. The horizontal portion of the wire is parallel to the top horizontal edge of the superconducting quantum interference device loop, but at a different Y coordinate. The horizontal portion of the wire can also be parallel to the bottom horizontal edge of the superconducting quantum interference device loop, as illustrated in FIG. 20, and in FIGS. 23 and 24 below.

Figure 21:
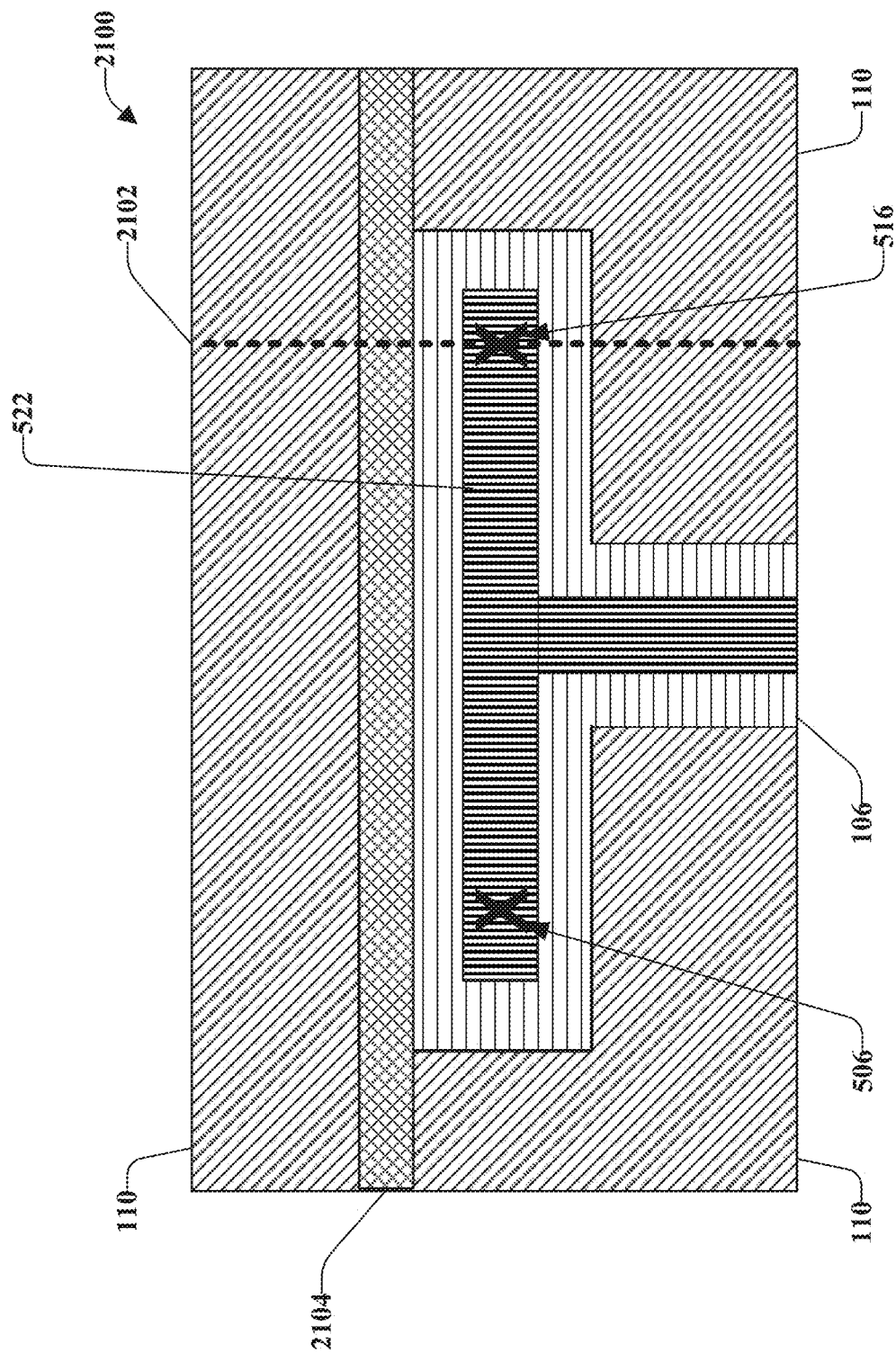
FIG. 21 illustrates an example, non-limiting, top view of a flux control circuit for control through a top superconducting layer of a superconducting quantum interference device in accordance with one or more embodiments described herein.
Figure 22:
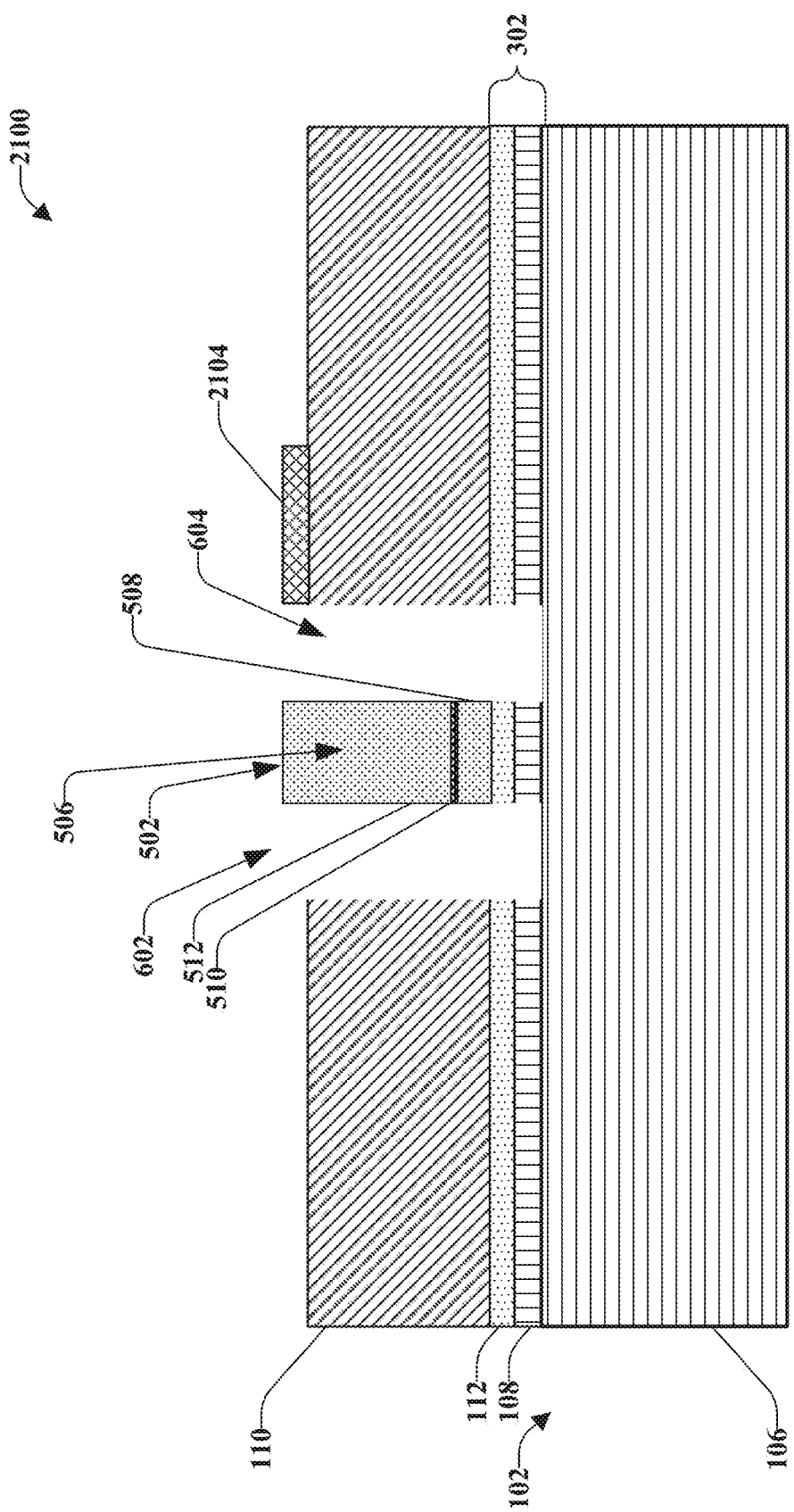
FIG. 22 illustrates an example, non-limiting, side cross-sectional view of the flux control circuit of FIG. 21 in accordance with one or more embodiments described herein.

FIG. 21 illustrates an example, non-limiting, top view of a flux control circuit 2100 for control through a top superconducting layer of a superconducting quantum interference device in accordance with one or more embodiments described herein. FIG. 22 illustrates an example, non-limiting, side cross-sectional view of the flux control circuit 2100 of FIG. 21 at line 2102 in accordance with one or more embodiments described herein. Repetitive description of like elements employed in other embodiments described herein is omitted for sake of brevity.

As illustrated, there can be a metal layer (e.g., a wire 2104) that can be parallel to the superconducting quantum interference device loop. As illustrated in FIG. 22, the wire 2104 is parallel and closest to the top of the second superconducting layer 522. The wire 2104 can be made in the second superconducting layer 522. Thus, the control of the superconducting quantum interference device is through a top superconductor. This would be one way of applying magnetic flux through the SQUID loop.

Figure 23:
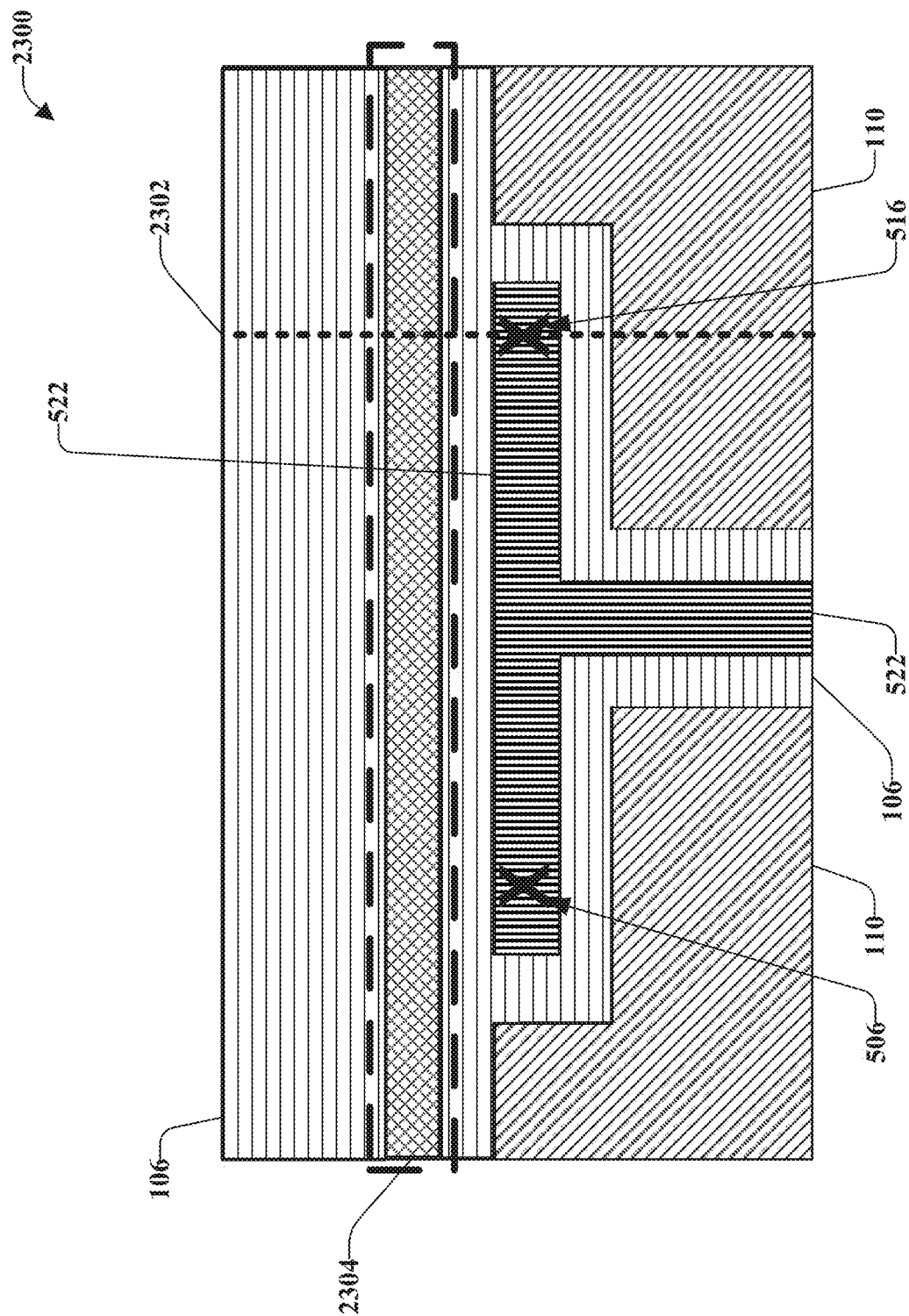
FIG. 23 illustrates an example, non-limiting, top view of another embodiment of a flux control circuit for flux control through a bottom superconducting layer of a superconducting quantum interference device in accordance with one or more embodiments described herein.
Figure 24:
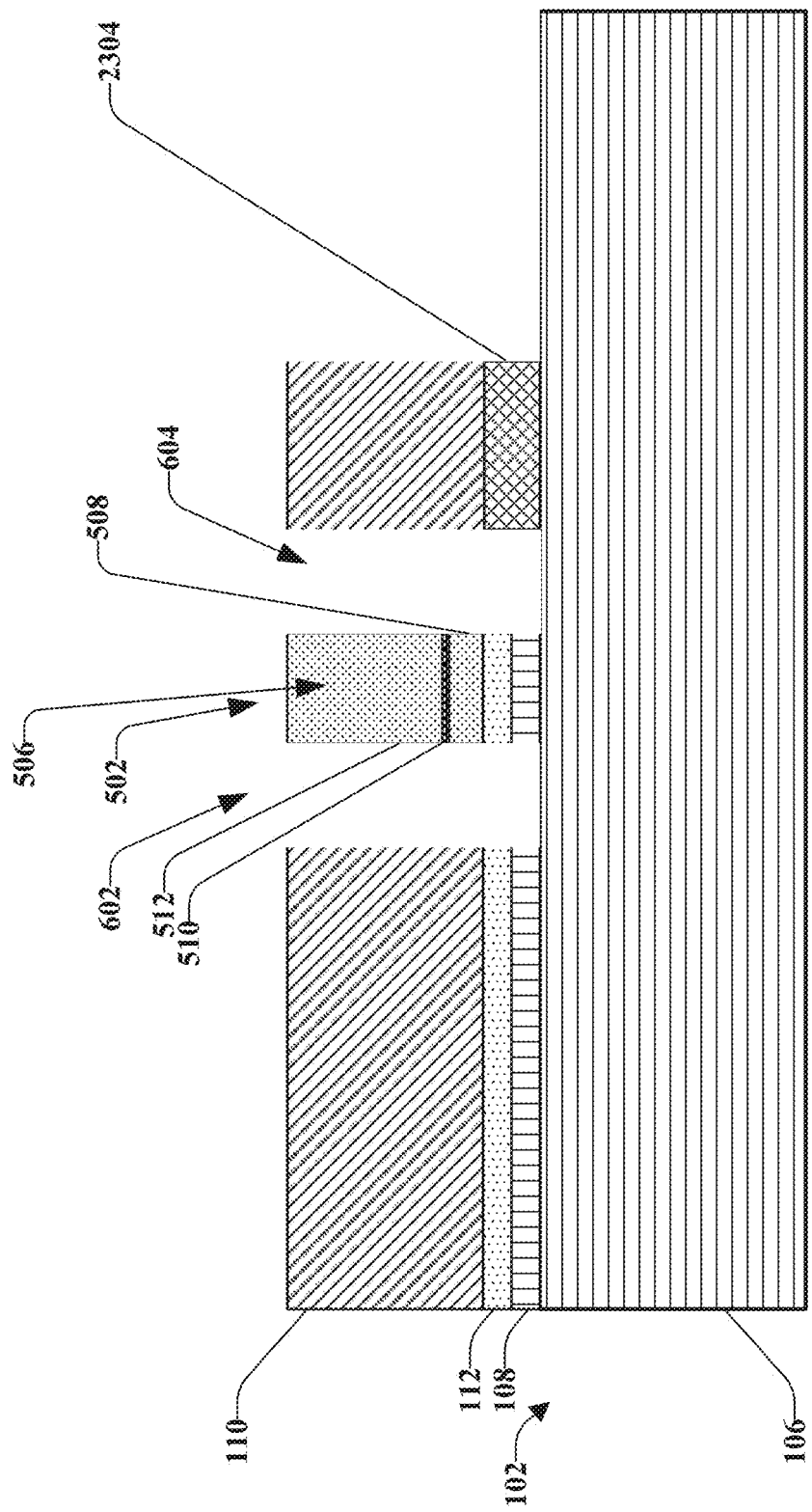
FIG. 24 illustrates an example, non-limiting, side cross-sectional view of the flux control circuit of FIG. 23 in accordance with one or more embodiments described herein.

FIG. 23 illustrates an example, non-limiting, top view of another embodiment of a flux control circuit 2300 for flux control through a bottom superconducting layer of a superconducting quantum interference device in accordance with one or more embodiments described herein. FIG. 24 illustrates an example, non-limiting, side cross-sectional view of the flux control circuit 2300 of FIG. 23 at line 2302 in accordance with one or more embodiments described herein. Repetitive description of like elements employed in other embodiments described herein is omitted for sake of brevity.

As illustrated, a wire 2304 can be parallel to the superconducting quantum interference device loop near the first crystalline silicon layer 106. The wire 2304 can be utilized to generate a magnetic flux through the SQUID loop.

It is noted that the top view of FIG. 23 does not illustrate the second crystalline silicon layer 110 over the wire 2304 for purposes of describing the invention, while the side cross-sectional view shows the second crystalline silicon layer 110 over the wire 2304. However, according to some implementations, the second crystalline silicon layer 110 can be removed from over the wire 2304. Benefits of retaining the second crystalline silicon layer 110 can be to protect the device from oxidation and/or exposure to elements. Benefits of removing the second crystalline silicon layer 110 include simplifying the fabrication of the device because the second crystalline silicon layer 110 can be etched down and the wire 2304 can be completely exposed.

Figure 25:
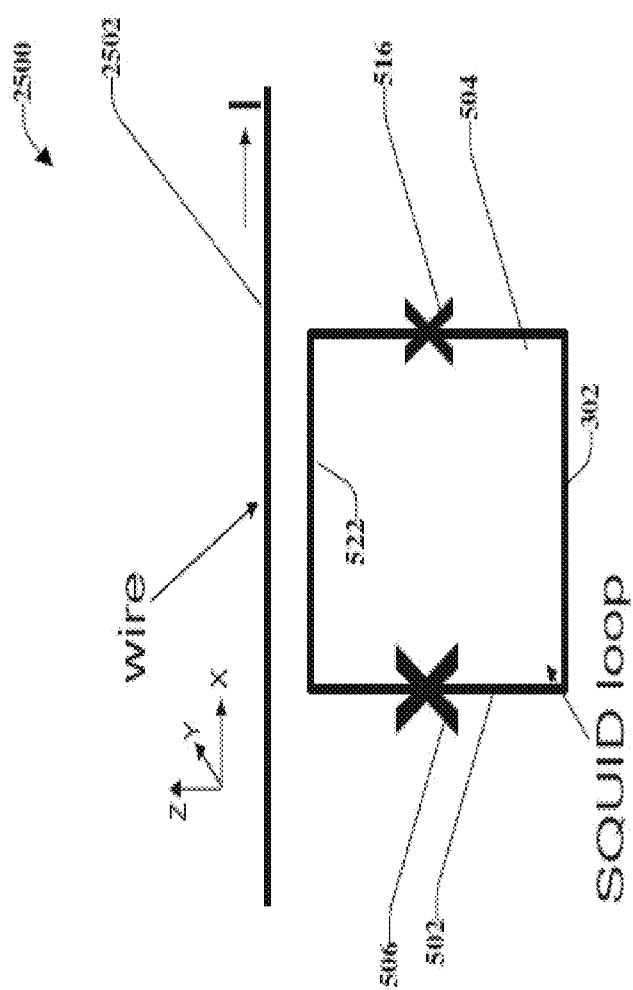
FIG. 25 illustrates an example, non-limiting, electrical schematic diagram of a third embodiment of flux control with a single wire in accordance with one or more embodiments described herein.
Figure 26:
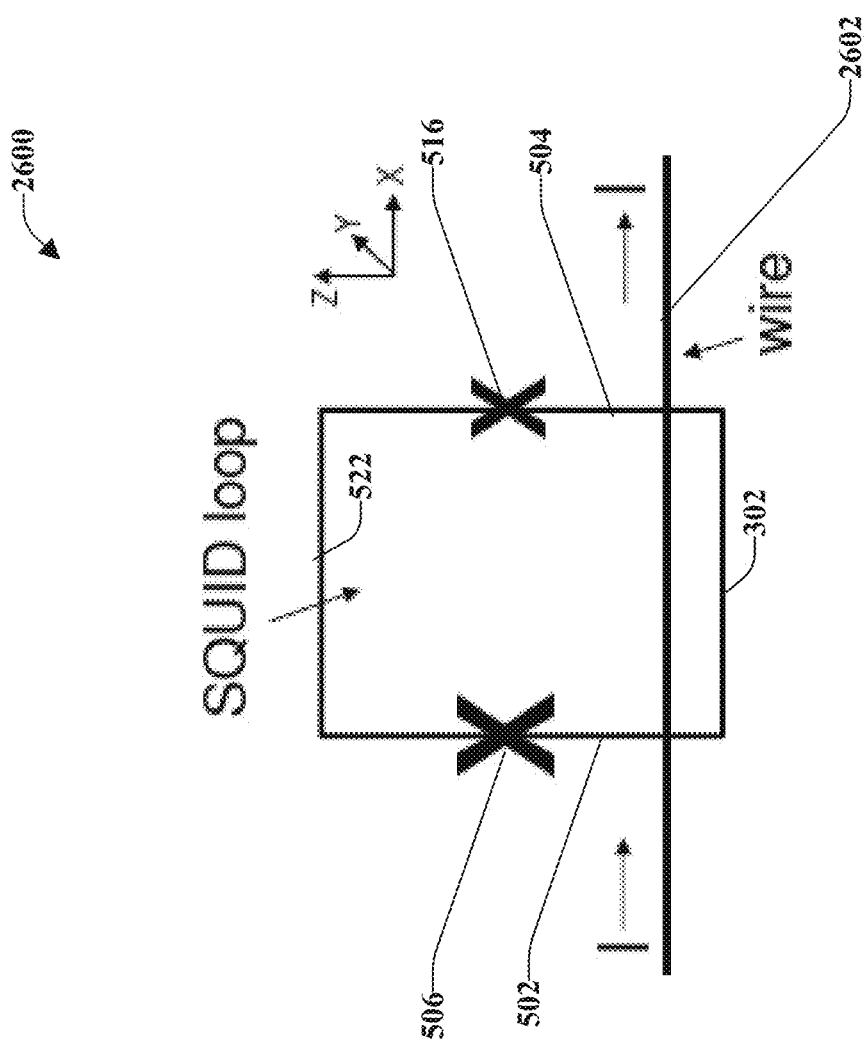
FIG. 26 illustrates an example, non-limiting, electrical schematic diagram of a fourth embodiment of flux control with a single wire in accordance with one or more embodiments described herein.

FIG. 25 illustrates an example, non-limiting, electrical schematic diagram of a third embodiment of flux control with a single wire 2500 in accordance with one or more embodiments described herein. FIG. 26 illustrates an example, non-limiting, electrical schematic diagram of a fourth embodiment of flux control with a single wire 2600 in accordance with one or more embodiments described herein. Repetitive description of like elements employed in other embodiments described herein is omitted for sake of brevity.

Instead of the wire with bends, as illustrated in FIG. 19 and FIG. 20, the wire (e.g., wire 2502 of FIG. 25 and wire 2602 of FIG. 26) can be a straight wire, preserving the porting that is parallel to the horizontal edge of the superconducting quantum interference device loop. The horizontal wire (e.g., the wire 2502, the wire 2602) is still at the same height (Z-coordinate) as the horizontal edge of the superconducting quantum interference device loop, but offset in the Y-direction.

Figure 27:
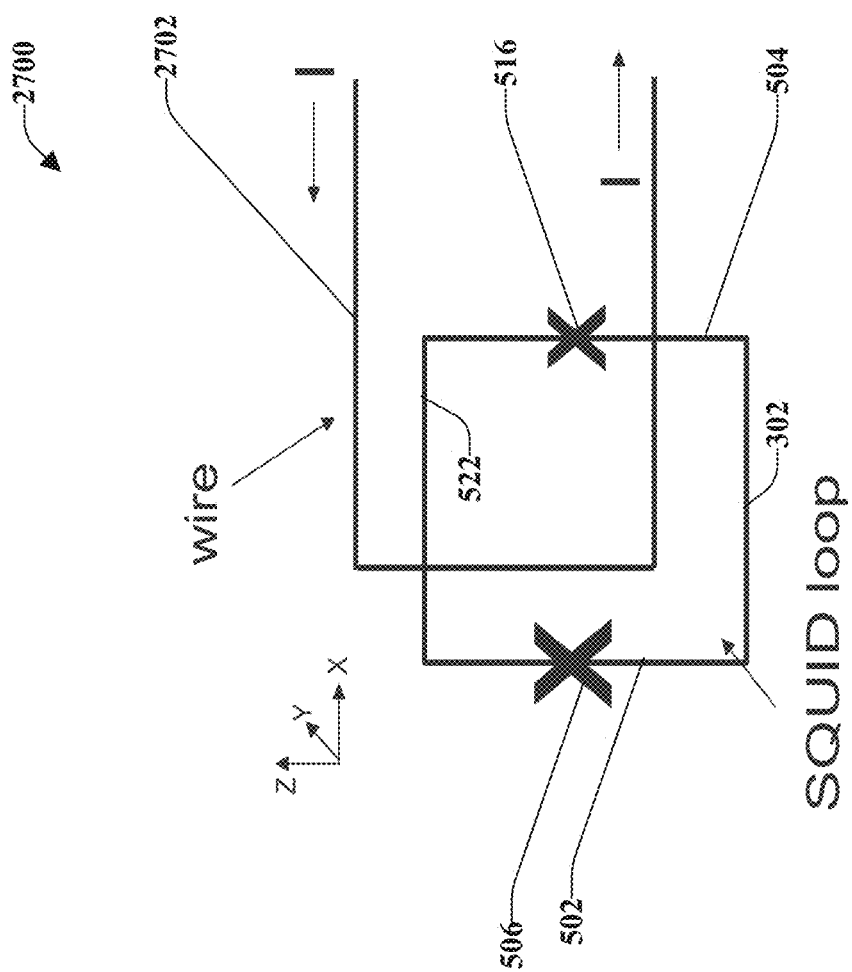
FIG. 27 illustrates an example, non-limiting, electrical schematic diagram of a fifth embodiment of flux control with a single wire in accordance with one or more embodiments described herein.

FIG. 27 illustrates an example, non-limiting, electrical schematic diagram of a fifth embodiment of flux control with a single wire 2700 in accordance with one or more embodiments described herein. A wire 2702 can carry a current I and can produce a magnetic field. In this embodiment, both horizontal portions (X) parallel to the loop and the vertical portion (Z) of the wire 2702 can generate the magnetic flux through the loop.

The magnetic field from the wire 2702 threads the superconducting quantum interference device loop, producing the magnetic flux φ1 through the superconducting quantum interference device. The vertical and horizontal edges of the wire are parallel to the vertical and horizontal edges of the superconducting quantum interference device loop, respectively, just shifted in the Y coordinate (into the depth of the page).

Figure 28:
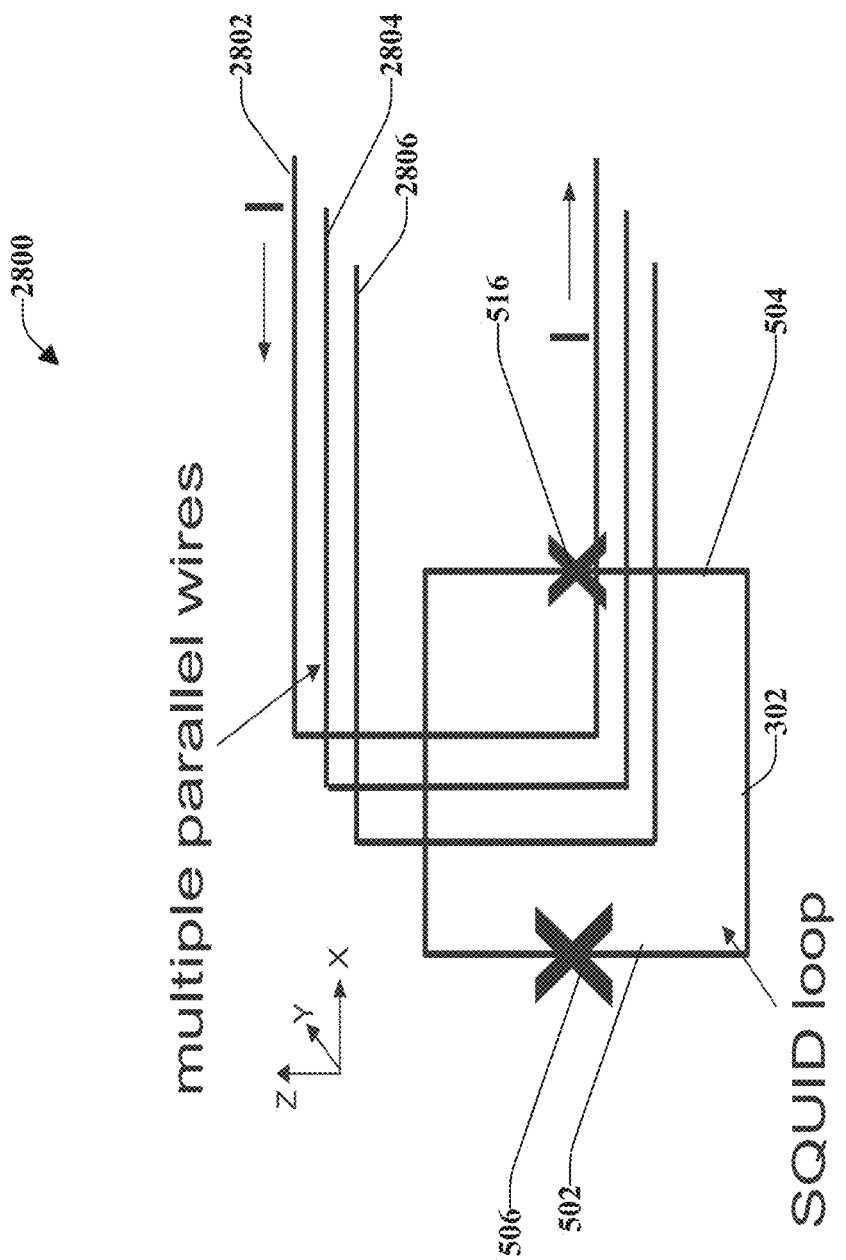
FIG. 28 illustrates an example, non-limiting, electrical schematic diagram of an embodiment of flux control with a multiple (parallel) wires in accordance with one or more embodiments described herein.

FIG. 28 illustrates an example, non-limiting, electrical schematic diagram of an embodiment of flux control with a multiple (parallel) wires 2800 in accordance with one or more embodiments described herein.

Illustrated are three wires, namely, a first wire 2802, a second wire 2804, and a third wire 2806. Respective wires carry a current and produce respective magnetic fields. Thus, the first wire 2802 carries a first current and produces a first magnetic field, the second wire 2804 carries a second current and produces a second magnetic field, and the third wire 2806 carries a third current and produces a third magnetic field.

The total magnetic field adds up from the multiple wires. The magnetic field from the wires threads the superconducting quantum interference device loop, producing the magnetic flux φ1 through the superconducting quantum interference device. Multiple wires can generate a larger magnetic field than can be produced by a single wire carrying the same current. It is noted that the wires (e.g., the first wire 2802, the second wire 2804, and the third wire 2806) are offset in the Y direction.

Figure 29:
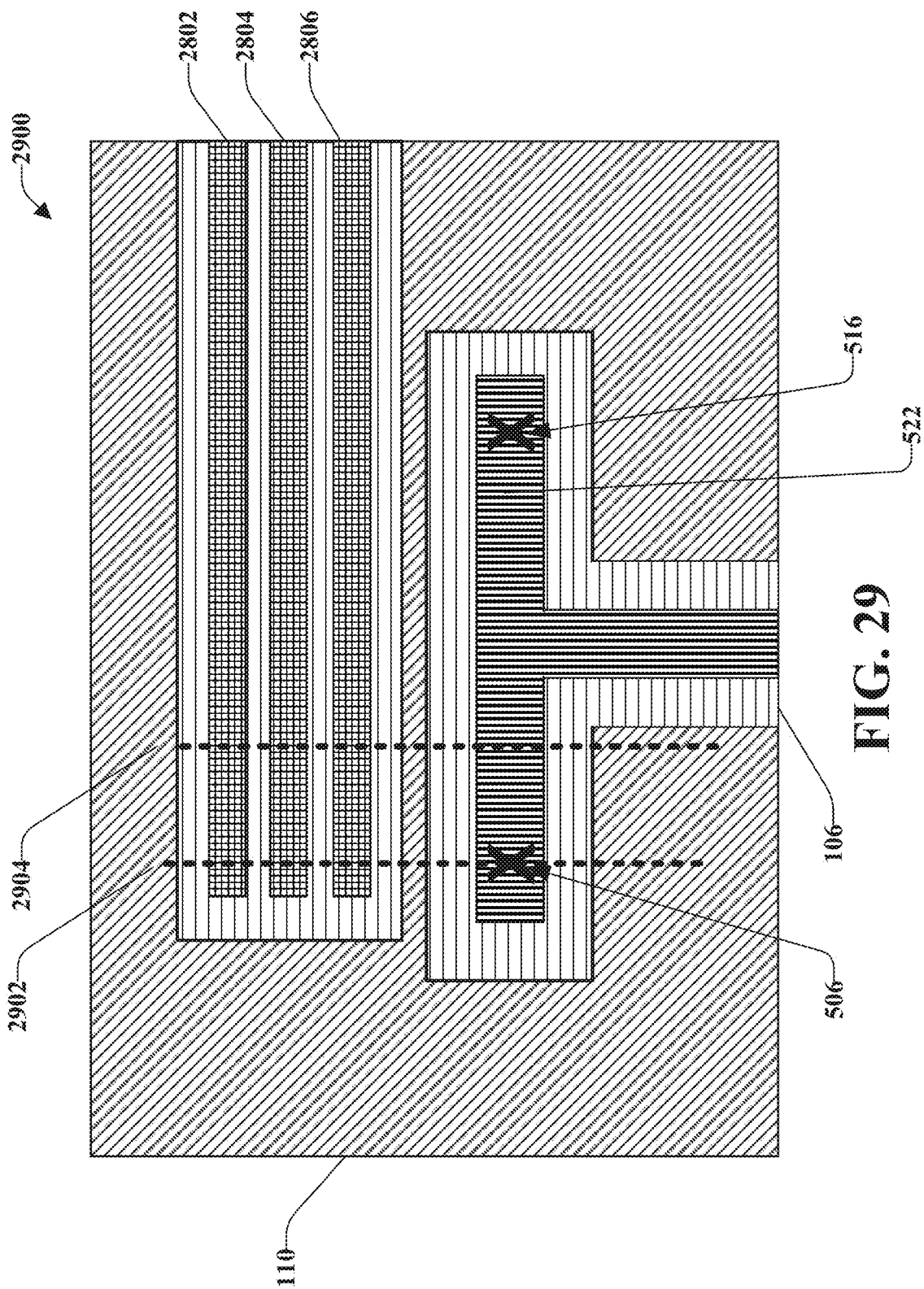
FIG. 29 illustrates an example, non-limiting, top view of an embodiment of a flux control circuit using multiple wires for flux control of a superconducting quantum interference device in accordance with one or more embodiments described herein.
Figure 30:
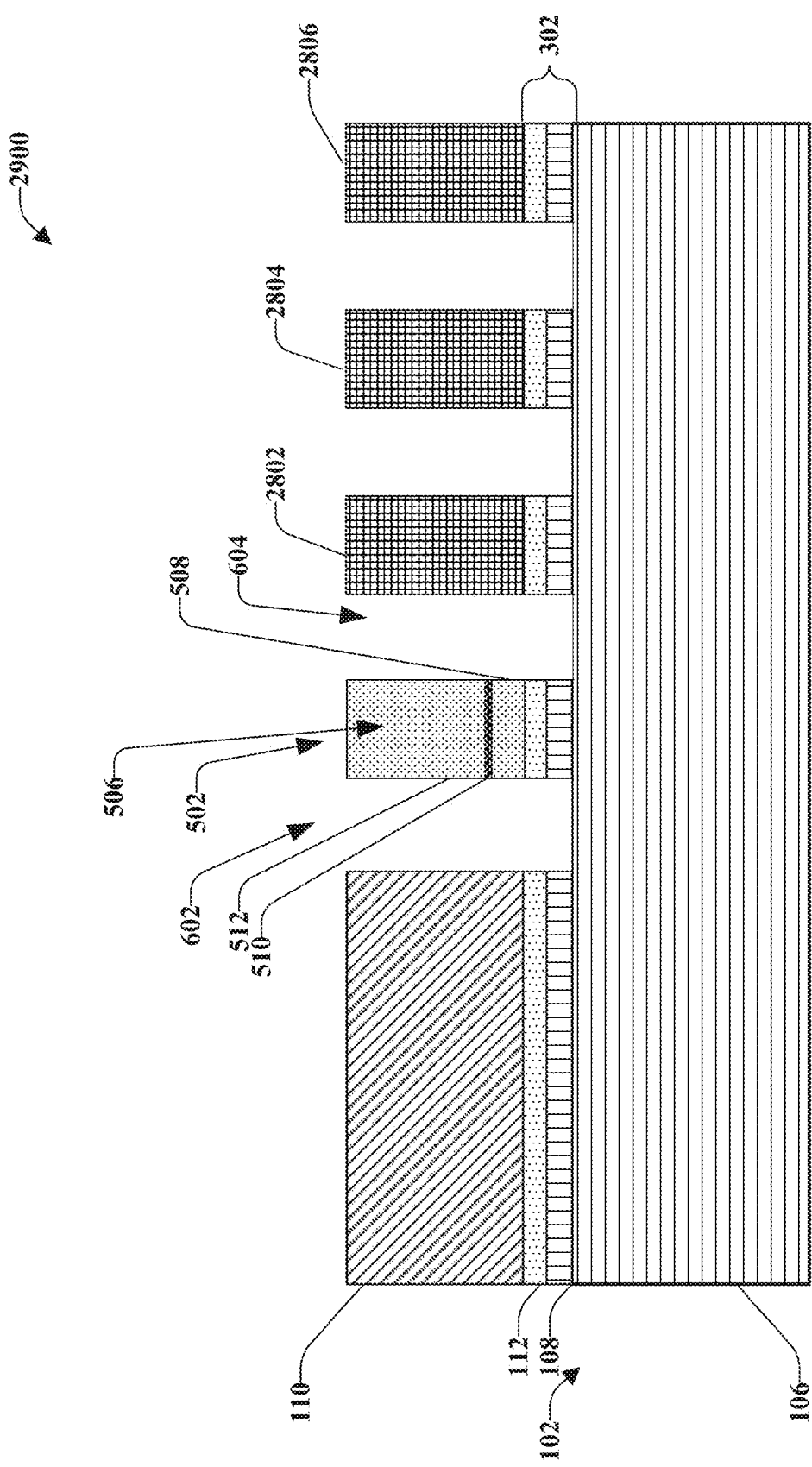
FIG. 30 illustrates an example, non-limiting, side cross-sectional view of the flux control circuit of FIG. 29 at a first cross-section line in accordance with one or more embodiments described herein.
Figure 31:
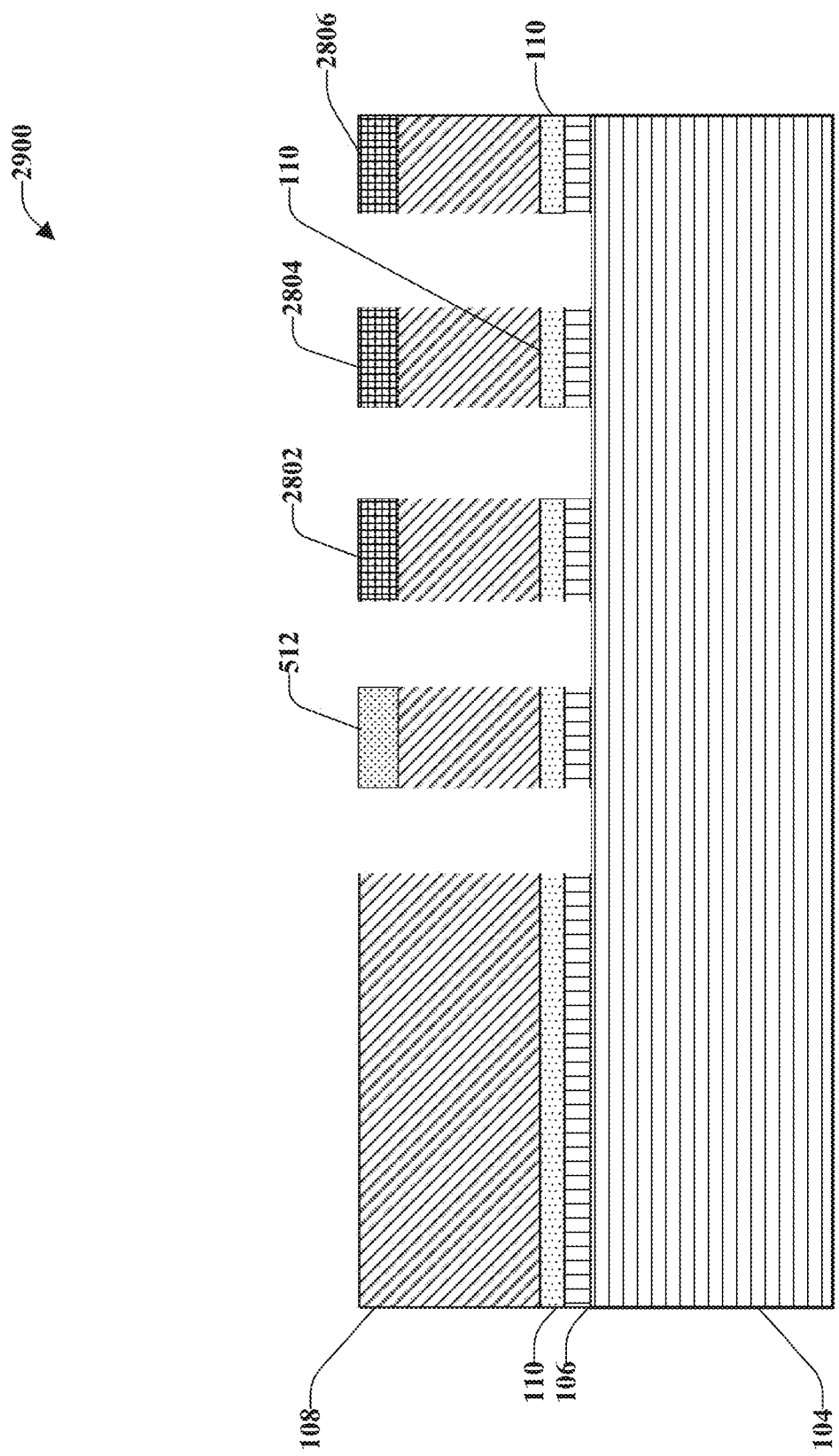
FIG. 31 illustrates an example, non-limiting, side cross-sectional view of the flux control circuit of FIG. 29 at a second cross-section line two in accordance with one or more embodiments described herein.

FIG. 29 illustrates an example, non-limiting, top view of an embodiment of a flux control circuit 2900 using multiple wires for flux control of a superconducting quantum interference device in accordance with one or more embodiments described herein. FIG. 30 illustrates an example, non-limiting, side cross-sectional view of the flux control circuit 2900 of FIG. 29 at cross-section line 2902 in accordance with one or more embodiments described herein. FIG. 31 illustrates an example, non-limiting, side cross-sectional view of the flux control circuit 2900 of FIG. 29 at cross-section line two 2904 in accordance with one or more embodiments described herein. Repetitive description of like elements employed in other embodiments described herein is omitted for sake of brevity.

Control of a superconducting quantum interference device can be through multiple wires in parallel (e.g., the first wire 2802, the second wire 2804, and the third wire 2806) that form loops in parallel, for added flux applied to the superconducting quantum interference device. Further, etching a region around the superconducting quantum interference device (e.g., shaping a bottom wire) can be a last step.

Figure 32:
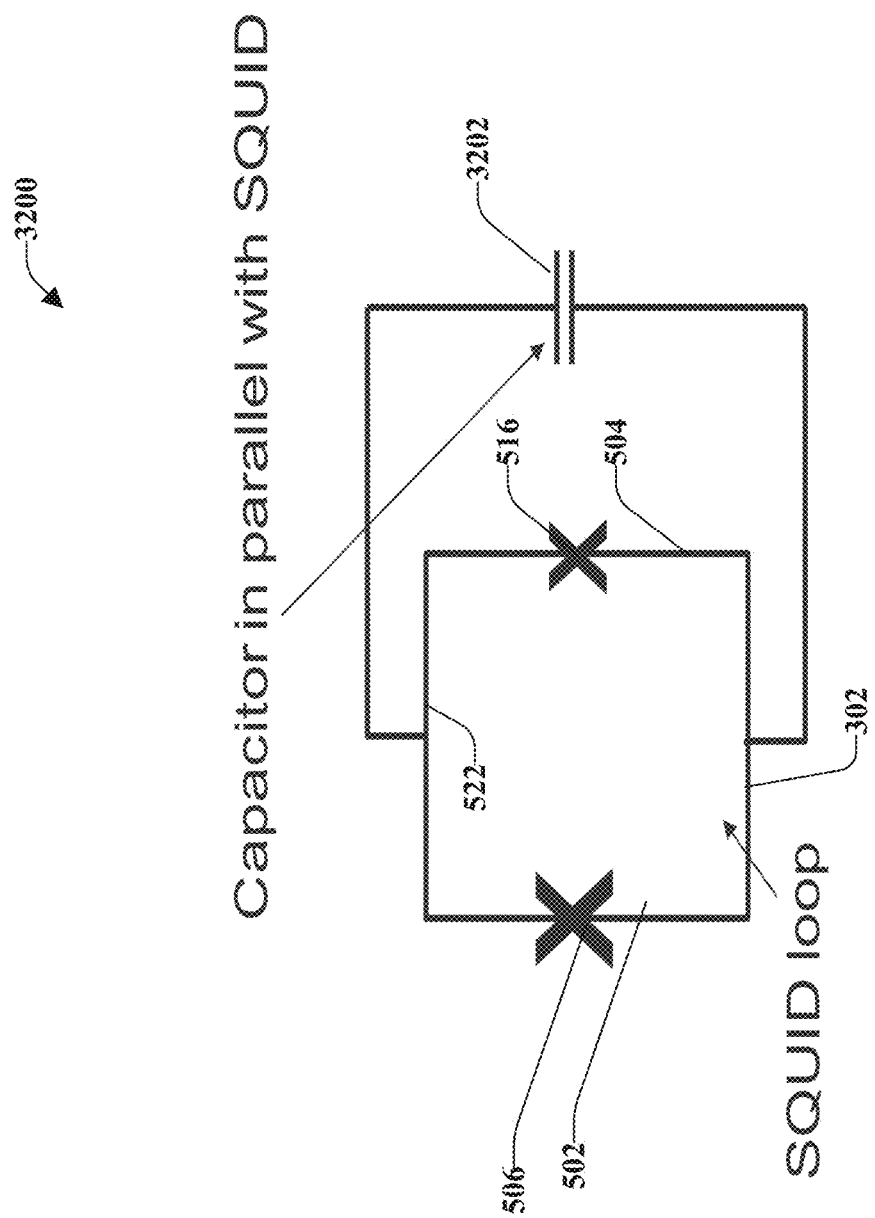
FIG. 32 illustrates an example, non-limiting electrical schematic diagram of an embodiment of a tunable transmon qubit using a superconducting quantum interference device in accordance with one or more embodiments described herein.

FIG. 32 illustrates an example, non-limiting electrical schematic diagram of an embodiment 3200 of a tunable transmon qubit using a superconducting quantum interference device in accordance with one or more embodiments described herein. Repetitive description of like elements employed in other embodiments described herein is omitted for sake of brevity.

To form a (tunable) transmon qubit, the superconducting quantum interference device loop can be shunted by a capacitor 3202 (in parallel with the superconducting quantum interference device). The total capacitance in parallel with the Josephson junctions should be of a specific value to form a transmon qubit. The capacitor 3202 can be implemented either by utilizing substantially parallel elongated wires, as illustrated in FIG. 13 and FIG. 14, or substantially parallel plates (with larger area to increase the total capacitance), as illustrated in FIG. 15 and FIG. 16.

The two junctions (e.g., the first Josephson junction 506, the second Josephson junction 516) in the superconducting quantum interference device loop can have the same or different critical currents, making it a symmetric or an asymmetric superconducting quantum interference device. The superconducting quantum interference device can be flux biased with a magnetic flux as discussed above. The transmon qubit can be coupled to other qubits as well as external circuitry (read/write) according to some implementations.

As discussed herein, according to some implementations, a vertical superconducting quantum interference device is provided that is oriented differently from traditional superconducting quantum interference devices, allows for different coupling and biasing geometries, and occupies minimal footprint as compared to traditional superconducting quantum interference devices. Also provided is the capability of magnetically controlling the device through nearby/local superconducting wires and interconnects. In addition, fields parallel to the substrate can be used or detected as compared to traditional superconducting quantum interference devices.

Further, a crystalline dielectric enables superior loss characteristics and circuit performance for qubits as compared to conventional techniques in which superconducting quantum interference device loops orthogonal to the surface can utilize deposited dielectrics and therefore are not useful as qubits.

Figure 33:
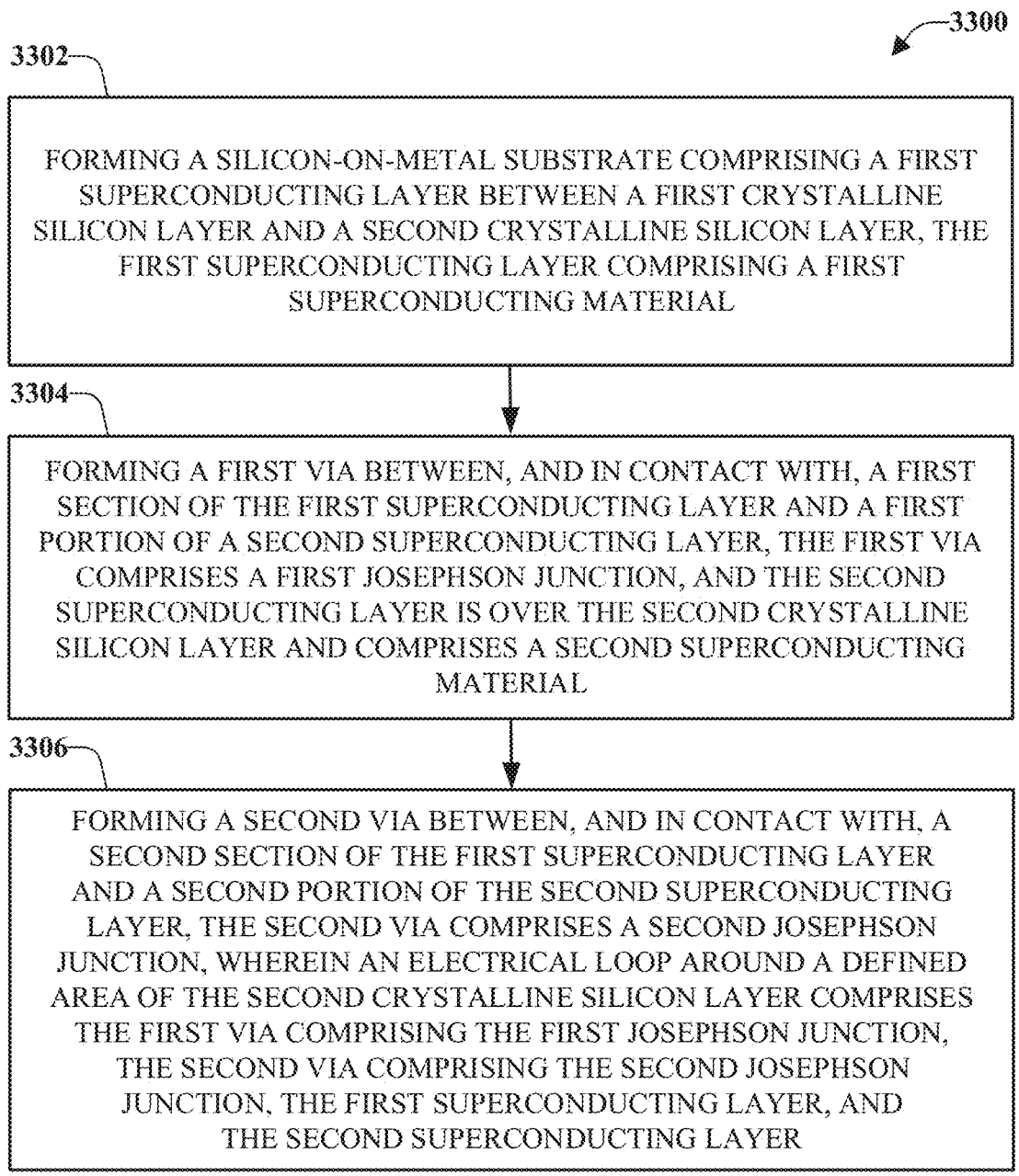
FIG. 33 illustrates a flow diagram of an example, non-limiting, method for fabricating a superconducting quantum interference device in accordance with one or more embodiments described herein.

FIG. 33 illustrates a flow diagram of an example, non-limiting, method 3300 for fabricating a superconducting quantum interference device in accordance with one or more embodiments described herein. Repetitive description of like elements employed in other embodiments described herein is omitted for sake of brevity.

The method 3300 can include, at 3302, forming a silicon-on-metal substrate comprising a first superconducting layer (e.g., the first superconducting layer 302) between a first crystalline silicon layer (e.g., the first crystalline silicon layer 106) and a second crystalline silicon layer (e.g., the second crystalline silicon layer 110). The first superconducting layer can comprise a first superconducting material. A shape of the second superconducting layer can be selected based on a defined shape of the electrical loop.

Further, at 3304, the method 3300 can comprise forming a first via (e.g., the first via 502) and a second via (e.g., the second via 504). The first via can be formed between, and in contact with, a first section of the first superconducting layer and a first portion of a second superconducting layer. The first via can comprise a first Josephson junction (e.g., the first Josephson junction 506). Further, the second superconducting layer can be over the second crystalline silicon layer and can comprise a second superconducting material.

A second via can be formed between, and in contact with, a second section of the first superconducting layer and a second portion of the second superconducting layer. The second via can comprise a second Josephson junction (e.g., the second Josephson junction 516). An electrical loop around a defined area of the second crystalline silicon layer can comprise the first via comprising the first Josephson junction, the second via comprising the second Josephson junction, the first superconducting layer, and the second superconducting layer.

Figure 34:
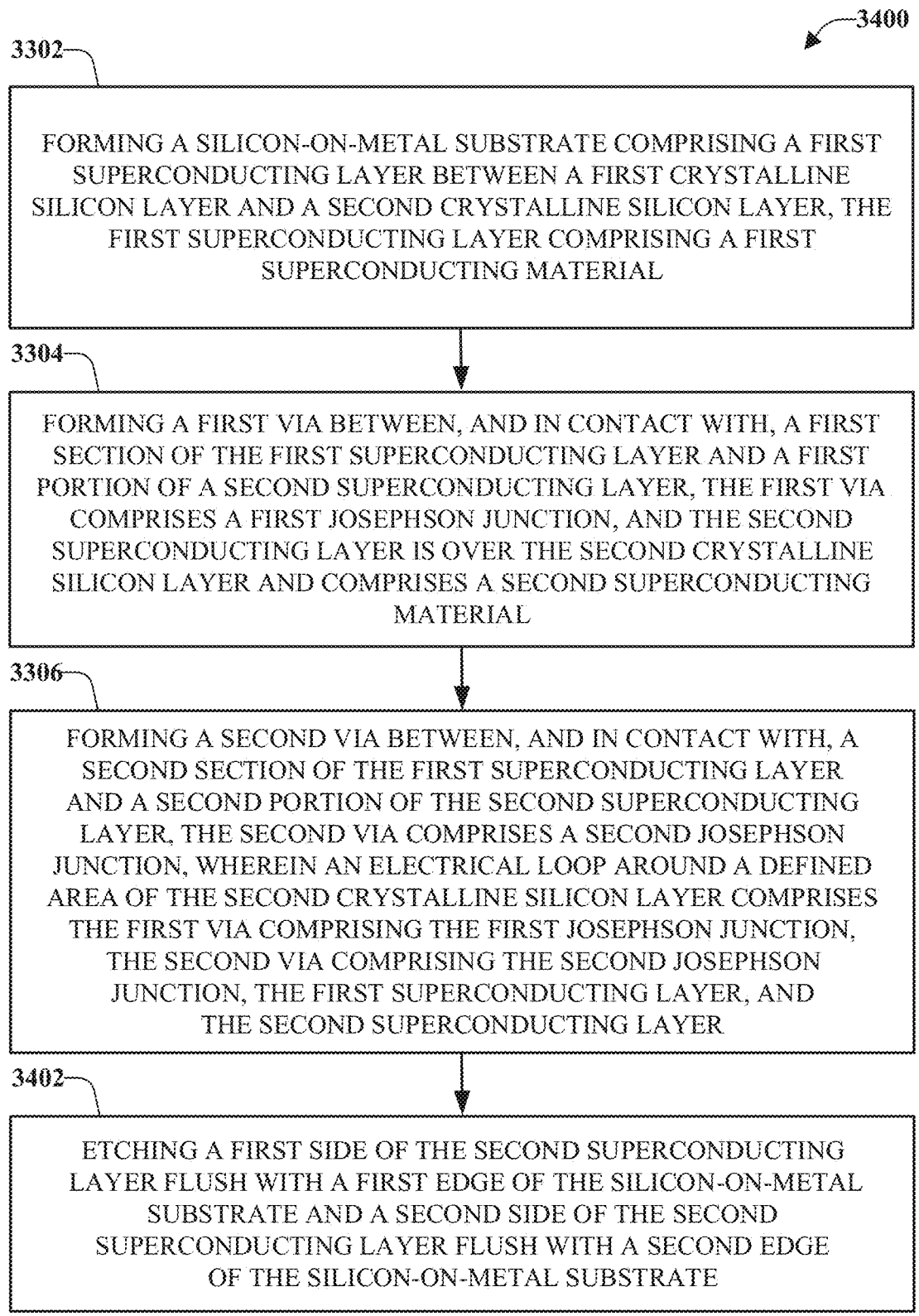
FIG. 34 illustrates a flow diagram of an example, non-limiting, method for forming a second superconducting layer of a superconducting quantum interference device in accordance with one or more embodiments described herein.

FIG. 34 illustrates a flow diagram of an example, non-limiting, method 3400 for forming a second superconducting layer of a superconducting quantum interference device in accordance with one or more embodiments described herein. Repetitive description of like elements employed in other embodiments described herein is omitted for sake of brevity.

At 3402 of the method, a first side of the second superconducting layer can be etched flush with a first edge of the silicon-on-metal substrate and a second side of the second superconducting layer can be flush with a second edge of the silicon-on-metal substrate. For example, the first side of the second superconducting layer, can be a first portion of the second superconducting layer that extends in an outward direction to the left of the first via as illustrated in FIG. 6. Further, the second side of the second superconducting layer, can be a second portion of the second superconducting layer that extends in an outward direction to the right of the first via as illustrated in FIG. 6.

According to an example, the first edge can be the first side of the second superconducting layer that is flush with a first trench (e.g., the first trench 602), as illustrated in FIG. 6. The second edge of the second superconducting layer can be the second side of the second superconducting layer that is flush with a second trench (e.g., the second trench 604), as illustrated in FIG. 6.

In another example, the first edge can be can be the first side of the second superconducting layer that is flush with the first via and the second edge of the second superconducting layer that is flush with a second via, as illustrated in FIG. 10. According to this example, a first section (e.g., the first section 608) of the second superconducting layer between the first via and the first trench and a second section (e.g., the second section 612) of the second superconducting layer between the second via and the second trench can be removed.

Figure 35:
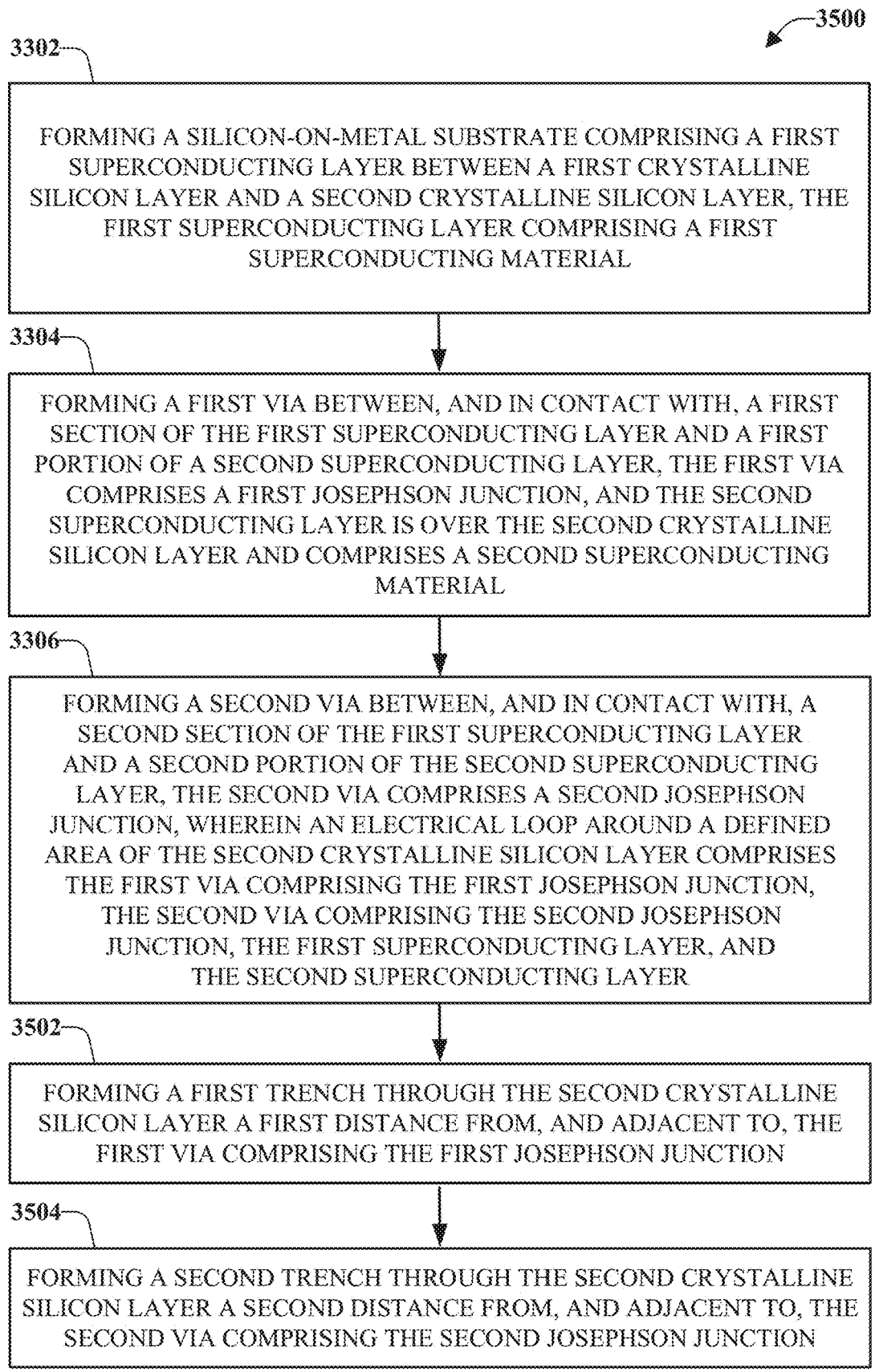
FIG. 35 illustrates a flow diagram of an example, non-limiting, method for electrically isolating a superconducting quantum interference device in accordance with one or more embodiments described herein.

FIG. 35 illustrates a flow diagram of an example, non-limiting, method 3500 for electrically isolating a superconducting quantum interference device in accordance with one or more embodiments described herein. Repetitive description of like elements employed in other embodiments described herein is omitted for sake of brevity.

At 3502, a first trench (e.g., the first trench 602) can be formed through the second crystalline silicon layer a first distance from, and adjacent to, the first via comprising the first Josephson junction. According to some implementations, the first distance can comprise at least a portion of silicon (e.g., the second crystalline silicon layer 110) between the first Josephson junction and the first trench. However, in accordance with other implementations, there is no silicon between the first Josephson junction and the first trench (e.g., a side of the first Josephson junction is exposed).

Further, at 3504, a second trench (e.g., the second trench 604) can be formed through the second crystalline silicon layer a second distance from, and adjacent to, the second via comprising the second Josephson junction. According to some implementations, the second distance can comprise at least a portion of silicon (e.g., the second crystalline silicon layer 110) between the second Josephson junction and the second trench. However, in accordance with other implementations, there is no silicon between the second Josephson junction and the second trench (e.g., a side of the second Josephson junction is exposed).

Figure 36:
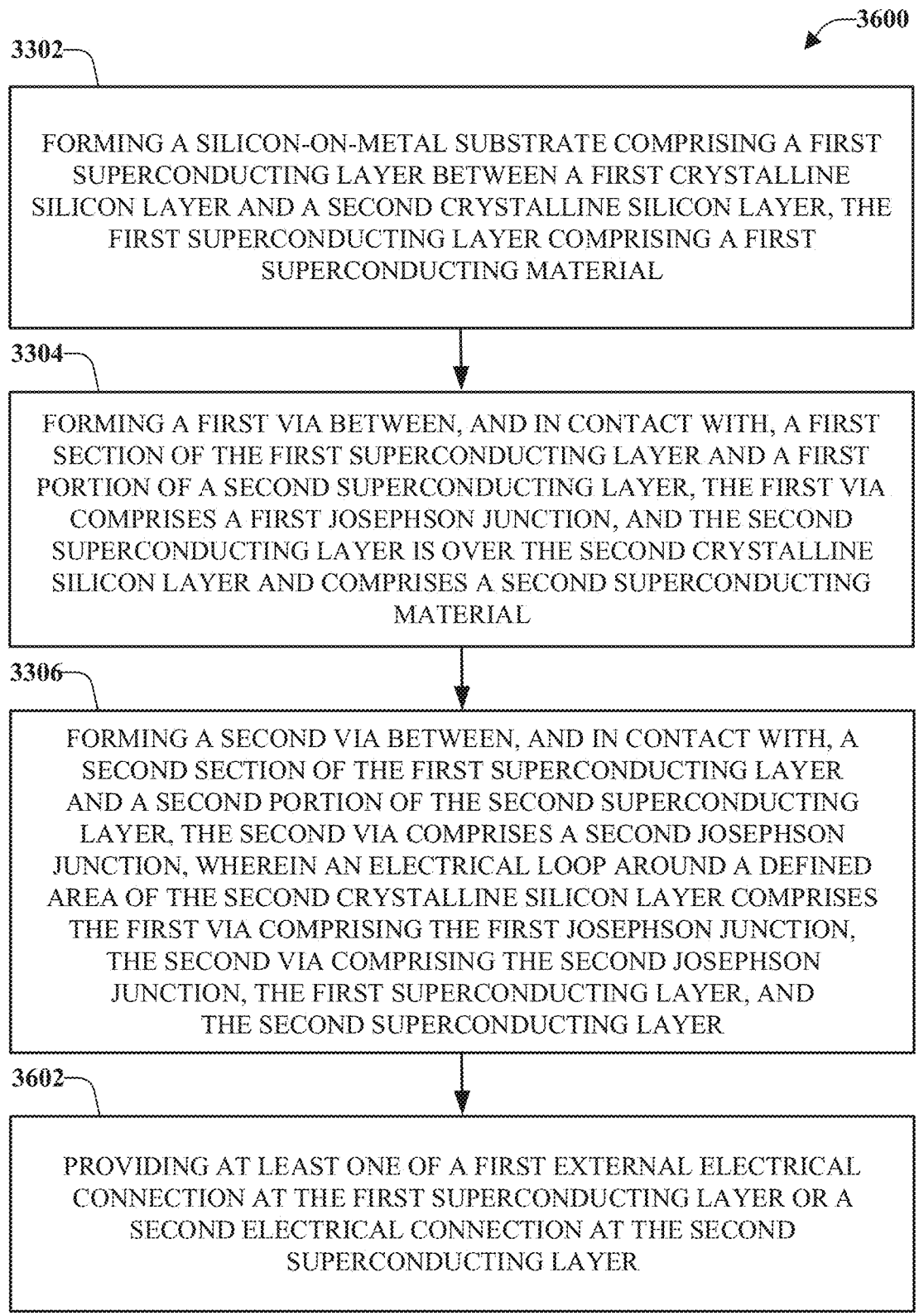
FIG. 36 illustrates a flow diagram of an example, non-limiting, method for providing a biasing circuit for a superconducting quantum interference device in accordance with one or more embodiments described herein.

FIG. 36 illustrates a flow diagram of an example, non-limiting, method 3600 for providing a biasing circuit for a superconducting quantum interference device in accordance with one or more embodiments described herein. Repetitive description of like elements employed in other embodiments described herein is omitted for sake of brevity.

At 3602 of the method 3600, providing at least one of a first external electrical connection at the first superconducting layer or a second electrical connection at the second superconducting layer. For example, electrical biasing can be provided through both the first superconducting layer and the second superconducting layer. In another example, a coupling capacitor (e.g., the coupling capacitor 1306) can be placed over the second crystalline silicon layer and at a first distance from the electrical loop and near an interconnect for an external electrical connection.

Figure 37:
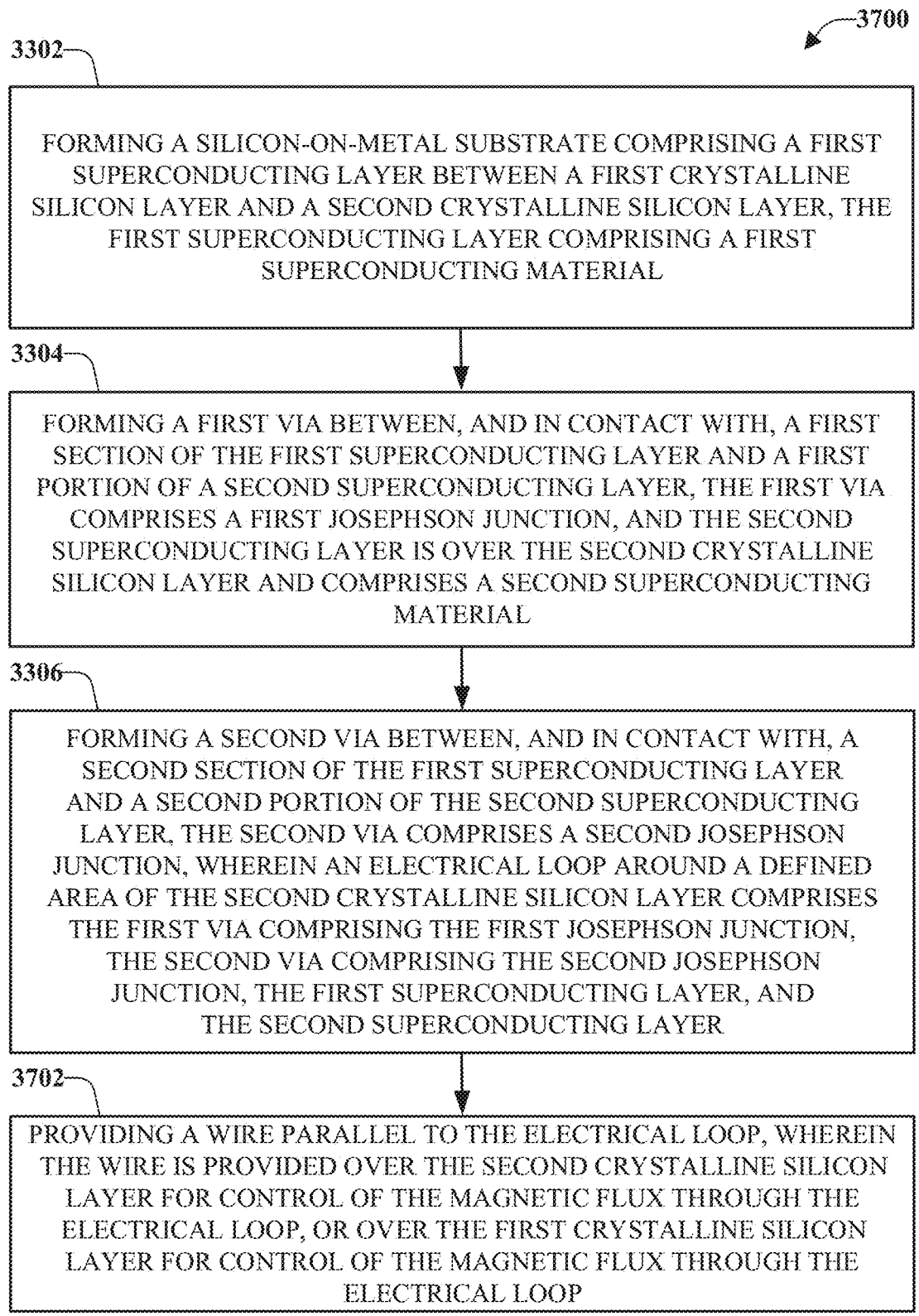
FIG. 37 illustrates a flow diagram of an example, non-limiting, method for providing flux control circuitry for a superconducting quantum interference device in accordance with one or more embodiments described herein.

FIG. 37 illustrates a flow diagram of an example, non-limiting, method 3700 for providing flux control circuitry for a superconducting quantum interference device in accordance with one or more embodiments described herein. Repetitive description of like elements employed in other embodiments described herein is omitted for sake of brevity.

At 3702 of the method 3700, a wire can be provided parallel to the electrical loop. For example, a wire (e.g., the wire 2104) can be provided over the second crystalline silicon layer for control of the magnetic flux through the electrical loop of the superconducting quantum interference devices. Alternatively, or additionally, a wire (e.g., the wire 2304) can be provided over the first crystalline silicon layer for control of the magnetic flux through the electrical loop of the superconducting quantum interference device.

Figure 38:
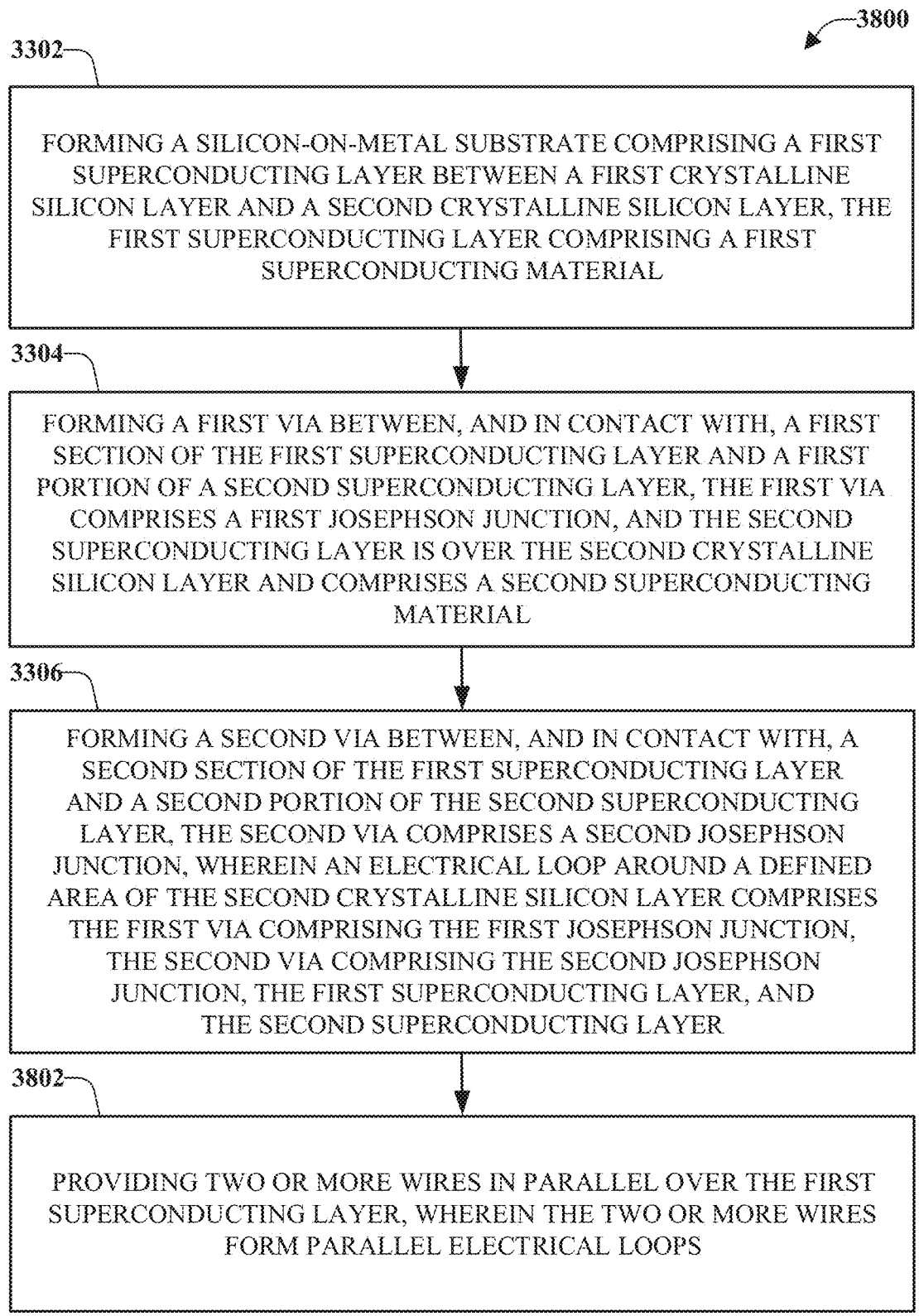
FIG. 38 illustrates a flow diagram of an example, non-limiting, method for providing multiple parallel wires for flux control circuitry for a superconducting quantum interference device in accordance with one or more embodiments described herein.

FIG. 38 illustrates a flow diagram of an example, non-limiting, method 3800 for providing multiple parallel wires for flux control circuitry for a superconducting quantum interference device in accordance with one or more embodiments described herein. Repetitive description of like elements employed in other embodiments described herein is omitted for sake of brevity.

At 3802 of the method 3800, two or more wires (e.g., the first wire 2802, the second wire 2804, the third wire 2806) can be provided in parallel over the first superconducting layer. The two or more wires can form parallel electrical loops. Respective wire carries its own current and produces a magnetic field. Thus, a first wire can carry a first current and produces a first magnetic field, a second wire can carry a second current and produces a second magnetic field, and a third wire can carry a third current and produces a third magnetic field.

Disclosed embodiments and/or aspects should neither be presumed to be exclusive of other disclosed embodiments and/or aspects, nor should a device and/or structure be presumed to be exclusive to its depicted elements in an example embodiment or embodiments of this disclosure, unless where clear from context to the contrary. The scope of the disclosure is generally intended to encompass modifications of depicted embodiments with additions from other depicted embodiments, where suitable, interoperability among or between depicted embodiments, where suitable, as well as addition of a component(s) from one embodiment(s) within another or subtraction of a component(s) from any depicted embodiment, where suitable, aggregation of elements (or embodiments) into a single devices achieving aggregate functionality, where suitable, or distribution of functionality of a single device into multiple device, where suitable. In addition, incorporation, combination or modification of devices or elements depicted herein or modified as stated above with devices, structures, or subsets thereof not explicitly depicted herein but known in the art or made evident to one with ordinary skill in the art through the context disclosed herein are also considered within the scope of the present disclosure.

For simplicity of explanation, the computer-implemented methodologies are depicted and described as a series of acts.

It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

Figure 39:
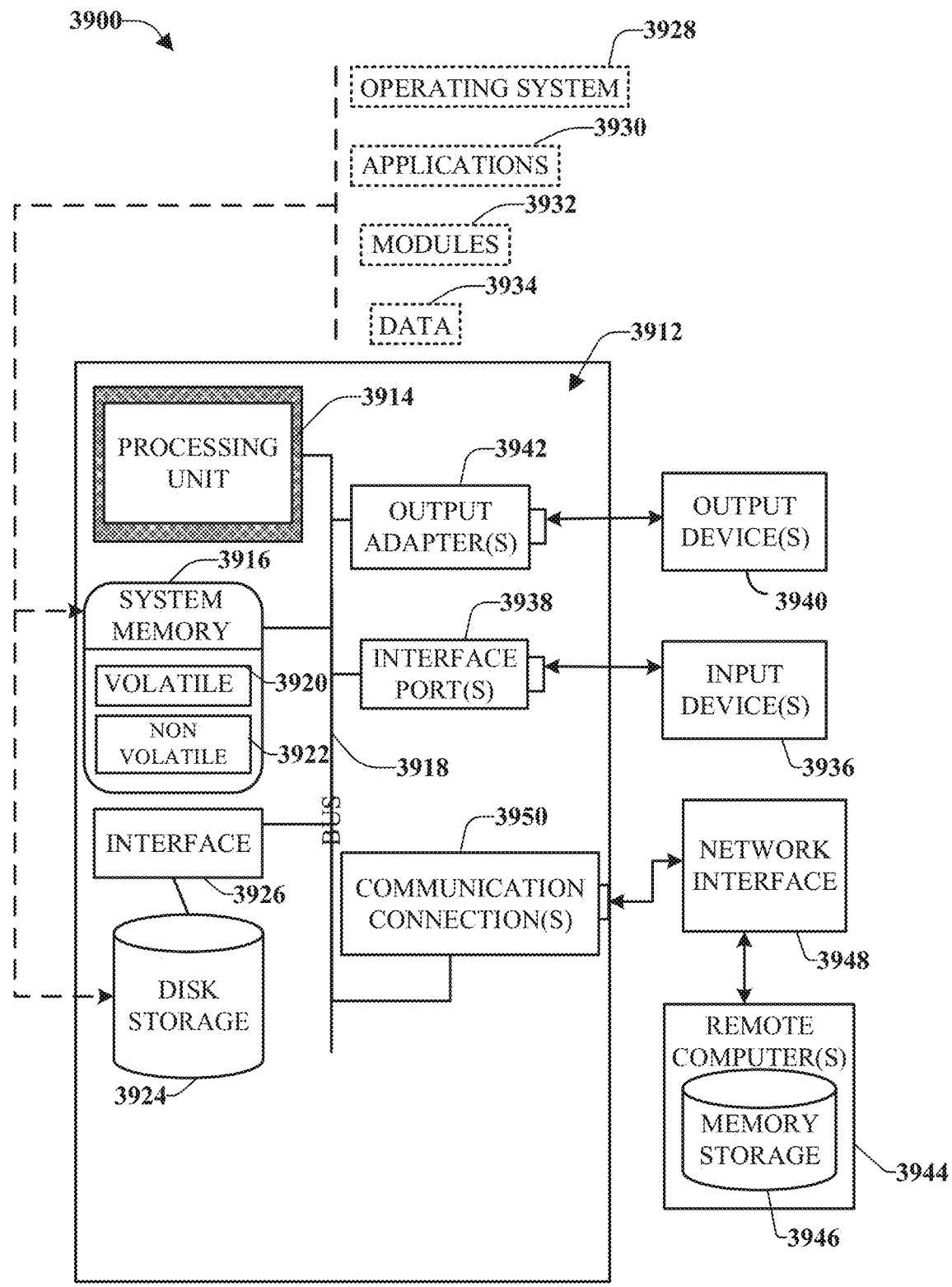
FIG. 39 illustrates a block diagram of an example, non-limiting, operating environment in which one or more embodiments described herein can be facilitated.

In order to provide a context for the various aspects of the disclosed subject matter, FIG. 39 as well as the following discussion are intended to provide a general description of a suitable environment in which the various aspects of the disclosed subject matter can be implemented. FIG. 39 illustrates a block diagram of an example, non-limiting operating environment in which one or more embodiments described herein can be facilitated. Repetitive description of like elements employed in other embodiments described herein is omitted for sake of brevity. With reference to FIG. 39, a suitable operating environment 3900 for implementing various aspects of this invention can also include a computer 3912. The computer 3912 can also include a processing unit 3914, a system memory 3916, and a system bus 3918. The system bus 3918 couples system components including, but not limited to, the system memory 3916 to the processing unit 3914. The processing unit 3914 can be any of various available processors. Dual microprocessors and other multiprocessor architectures also can be employed as the processing unit 3914. The system bus 3918 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI). The system memory 3916 can also include volatile memory 3920 and nonvolatile memory 3922. The basic input/output system (BIOS), containing the basic routines to transfer information between elements within the computer 3912, such as during start-up, is stored in nonvolatile memory 3922. By way of illustration, and not limitation, nonvolatile memory 3922 can include read only memory (ROM), programmable ROM (PROM), electrically programmable ROM (EPROM), electrically erasable programmable ROM (EEPROM), flash memory, or nonvolatile random access memory (RAM) (e.g., ferroelectric RAM (FeRAM)). Volatile memory 3920 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 3912 can also include removable/non-removable, volatile/non-volatile computer storage media. FIG. 39 illustrates, for example, a disk storage 3924. Disk storage 3924 can also include, but is not limited to, devices like a magnetic disk drive, floppy disk drive, tape drive, Jaz drive, Zip drive, LS-100 drive, flash memory card, or memory stick. The disk storage 3924 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 3924 to the system bus 3918, a removable or non-removable interface is typically used, such as interface 3926. FIG. 39 also depicts software that acts as an intermediary between users and the basic computer resources described in the suitable operating environment 3900. Such software can also include, for example, an operating system 3928. Operating system 3928, which can be stored on disk storage 3924, acts to control and allocate resources of the computer 3912. System applications 3930 take advantage of the management of resources by operating system 3928 through program modules 3932 and program data 3934, e.g., stored either in system memory 3916 or on disk storage 3924. It is to be appreciated that this invention can be implemented with various operating systems or combinations of operating systems. A user enters commands or information into the computer 3912 through input device(s) 3936. Input devices 3936 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 3914 through the system bus 3918 via interface port(s) 3938. Interface port(s) 3938 include, for example, a serial port, a parallel port, a game port, and a universal serial bus (USB). Output device(s) 3940 use some of the same type of ports as input device(s) 3936. Thus, for example, a USB port can be used to provide input to computer 3912, and to output information from computer 3912 to an output device 3940. Output adapter 3942 is provided to illustrate that there are some output devices 3940 like monitors, speakers, and printers, among other output devices 3940, which require special adapters. The output adapters 3942 include, by way of illustration and not limitation, video and sound cards that provide a method of connection between the output device 3940 and the system bus 3918. It should be noted that other devices and/or systems of devices provide both input and output capabilities such as remote computer(s) 3944.

Computer 3912 can operate in a networked environment using logical connections to one or more remote computers, such as remote computer(s) 3944. The remote computer(s) 3944 can be a computer, a server, a router, a network PC, a workstation, a microprocessor based appliance, a peer device or other common network node and the like, and typically can also include many or all of the elements described relative to computer 3912. For purposes of brevity, only a memory storage device 3946 is illustrated with remote computer(s) 3944. Remote computer(s) 3944 is logically connected to computer 3912 through a network interface 3948 and then physically connected via communication connection 3950. Network interface 3948 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 3950 refers to the hardware/software employed to connect the network interface 3948 to the system bus 3918. While communication connection 3950 is shown for illustrative clarity inside computer 3912, it can also be external to computer 3912. The hardware/software for connection to the network interface 3948 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create method for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this invention also can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this invention can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other method to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this specification, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or non-volatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this invention, but one of ordinary skill in the art can recognize that many further combinations and permutations of this invention are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
    forming a silicon-on-metal substrate comprising a first superconducting layer between a first crystalline silicon layer and a second crystalline silicon layer, the first superconducting layer comprising a first superconducting material;
    forming a first via between, and in contact with, a first section of the first superconducting layer and a first portion of a second superconducting layer, the first via comprises a first Josephson junction, and the second superconducting layer is over the second crystalline silicon layer and comprises a second superconducting material; and
    forming a second via between, and in contact with, a second section of the first superconducting layer and a second portion of the second superconducting layer, the second via comprises a second Josephson junction, wherein an electrical loop around a defined area of the second crystalline silicon layer comprises the first via comprising the first Josephson junction, the second via comprising the second Josephson junction, the first superconducting layer, and the second superconducting layer.

2. The method of claim 1, further comprising:
    etching a first side of the second superconducting layer flush with a first edge of the silicon-on-metal substrate and a second side of the second superconducting layer flush with a second edge of the silicon-on-metal substrate.

3. The method of claim 1, further comprising:
    forming a first trench through the second crystalline silicon layer a first distance from, and adjacent to, the first via comprising the first Josephson junction; and
    forming a second trench through the second crystalline silicon layer a second distance from, and adjacent to, the second via comprising the second Josephson junction.

4. The method of claim 1, further comprising:
    providing at least one of a first external electrical connection at the first superconducting layer or a second electrical connection at the second superconducting layer.

5. The method of claim 1, further comprising:
    providing a wire parallel to the electrical loop, wherein the wire is provided over the second crystalline silicon layer for control of the magnetic flux through the electrical loop, or over the first crystalline silicon layer for control of the magnetic flux through the electrical loop.

6. The method of claim 1, further comprising:
    providing two or more wires in parallel over the first superconducting layer, wherein the two or more wires form parallel electrical loops.

* * * * *